United States Patent
Ishikawa

(10) Patent No.: US 6,853,052 B2
(45) Date of Patent: Feb. 8, 2005

(54) SEMICONDUCTOR DEVICE HAVING A BUFFER LAYER AGAINST STRESS

(75) Inventor: Akira Ishikawa, Atsugi (JP)

(73) Assignee: Semiconductor Energy Laboratory Co., Ltd. (JP)

(*) Notice: Subject to any disclaimer, the term of this patent is extended or adjusted under 35 U.S.C. 154(b) by 8 days.

(21) Appl. No.: 10/394,637

(22) Filed: Mar. 21, 2003

(65) Prior Publication Data

US 2003/0186489 A1 Oct. 2, 2003

(30) Foreign Application Priority Data

Mar. 26, 2002 (JP) ......................................... 2002-086655

(51) Int. Cl.$^7$ .............................................. H01L 29/00
(52) U.S. Cl. ........................... 257/532; 257/59; 257/64; 257/66; 257/68; 257/359; 257/528; 257/534; 257/535; 257/903; 257/906; 257/908; 257/924
(58) Field of Search ............................... 257/59, 64, 66, 257/68, 359, 528, 532, 534–535, 903, 906, 908, 924

(56) References Cited

U.S. PATENT DOCUMENTS

| | | | | |
|---|---|---|---|---|
| 5,648,674 A | * | 7/1997 | Weisfield et al. | 257/428 |
| 5,667,597 A | * | 9/1997 | Ishihara | 136/258 |
| 5,734,449 A | * | 3/1998 | Jang | 349/39 |
| 5,815,226 A | * | 9/1998 | Yamazaki et al. | 349/111 |
| 6,121,652 A | | 9/2000 | Suzawa | 257/296 |
| 6,198,133 B1 | * | 3/2001 | Yamazaki et al. | 257/347 |
| 6,407,442 B2 | * | 6/2002 | Inoue et al. | 257/535 |
| 6,498,097 B1 | * | 12/2002 | Park et al. | 438/686 |
| 6,522,066 B2 | * | 2/2003 | Sheu et al. | 313/505 |
| 2002/0025614 A1 | * | 2/2002 | Jang et al. | 438/158 |
| 2002/0030188 A1 | * | 3/2002 | Hayashi et al. | 257/58 |
| 2002/0050599 A1 | * | 5/2002 | Lee et al. | 257/88 |
| 2003/0234424 A1 | * | 12/2003 | Suzawa et al. | 257/347 |
| 2004/0026740 A1 | * | 2/2004 | Kawasaki et al. | 257/350 |

FOREIGN PATENT DOCUMENTS

| | | |
|---|---|---|
| JP | 5-243519 | 9/1993 |
| JP | 7-074247 | 3/1995 |
| JP | 10-270363 | 10/1998 |

OTHER PUBLICATIONS

U.S. Appl. No. 09/535,836 to Ohtani et al filed Mar. 28, 2000, including specification, abstract, claims, drawings and PTO filing receipt.

English abstract of Japanese Patent Application No. JP 5–243519.

English abstract of Japanese Patent Application No. JP 7–074247.

* cited by examiner

*Primary Examiner*—Amir Zarabian
*Assistant Examiner*—Ida M. Soward
(74) *Attorney, Agent, or Firm*—Cook, Alex, McFarron, Manzo, Cummings & Mehler, Ltd.

(57) ABSTRACT

A semiconductor device and a method for preparing the same that can solve crack of a semiconductor film, capacitance electrodes and the like due to stress when forming a source electrode and a drain electrode in a semiconductor device having a thin film transistor and a holding capacitance with three or more capacitance electrodes is provided. Before forming the source electrode and the drain electrode, a crystalline silicon film for relaxing the stress is formed, then a contact hole connecting to the semiconductor film of the thin film transistor is opened, and a metal film to be the source electrode and the drain electrode is formed.

32 Claims, 14 Drawing Sheets

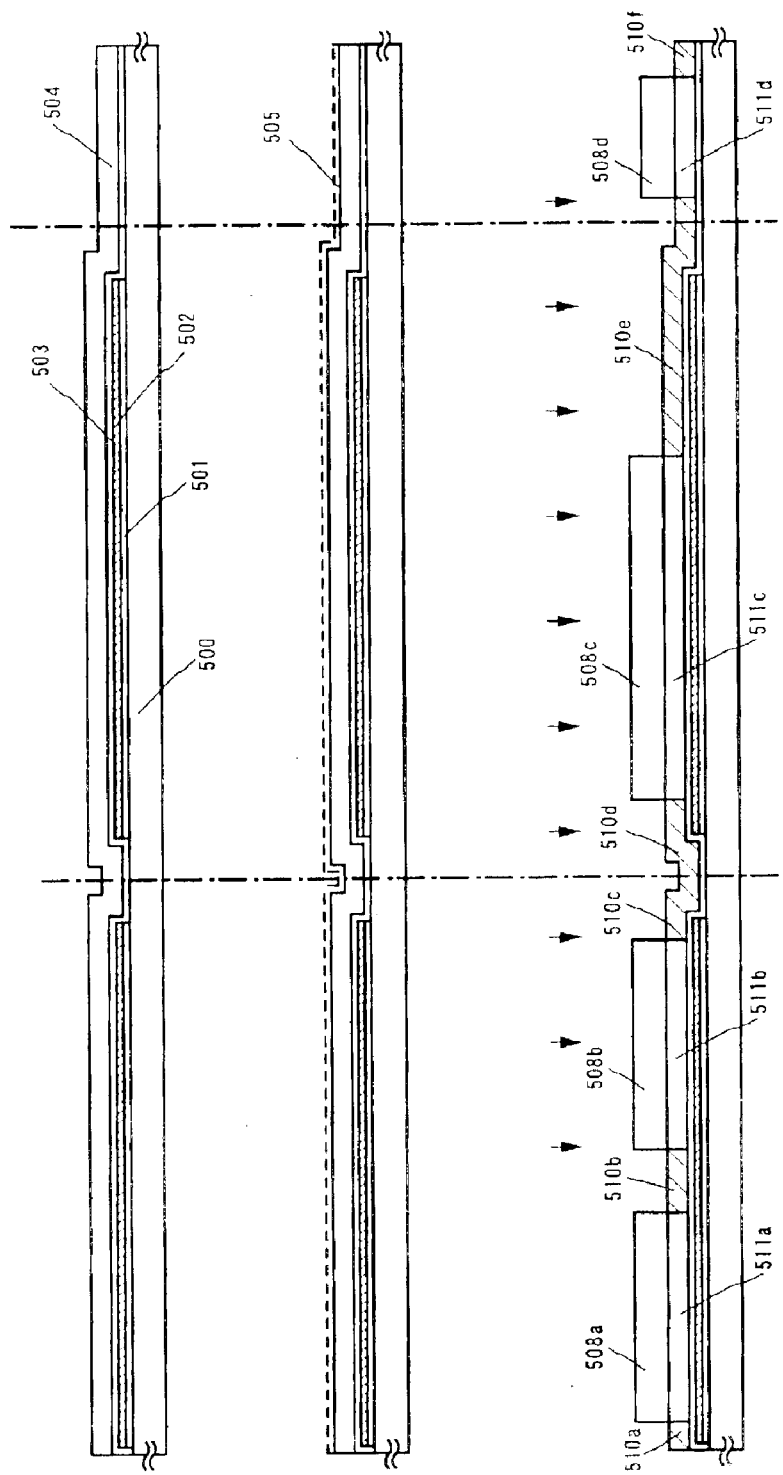

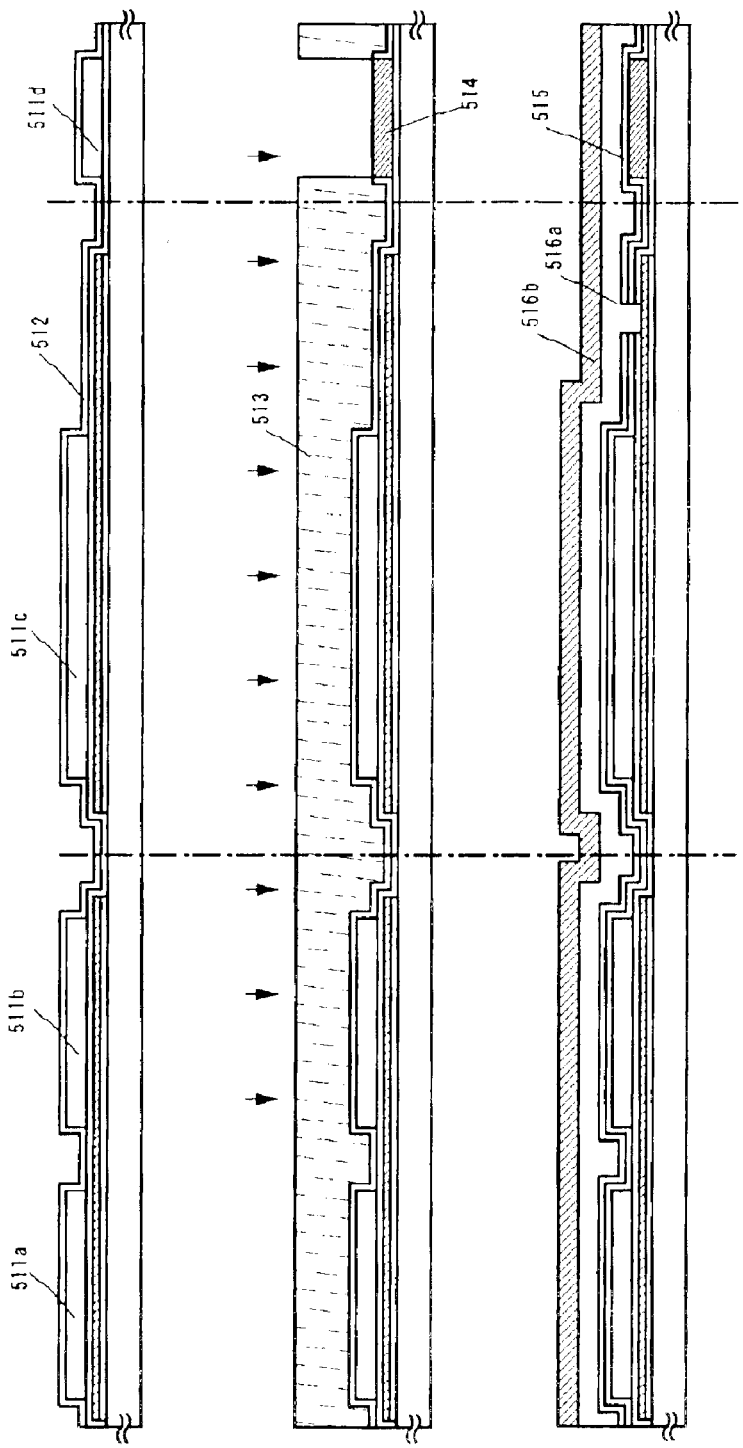

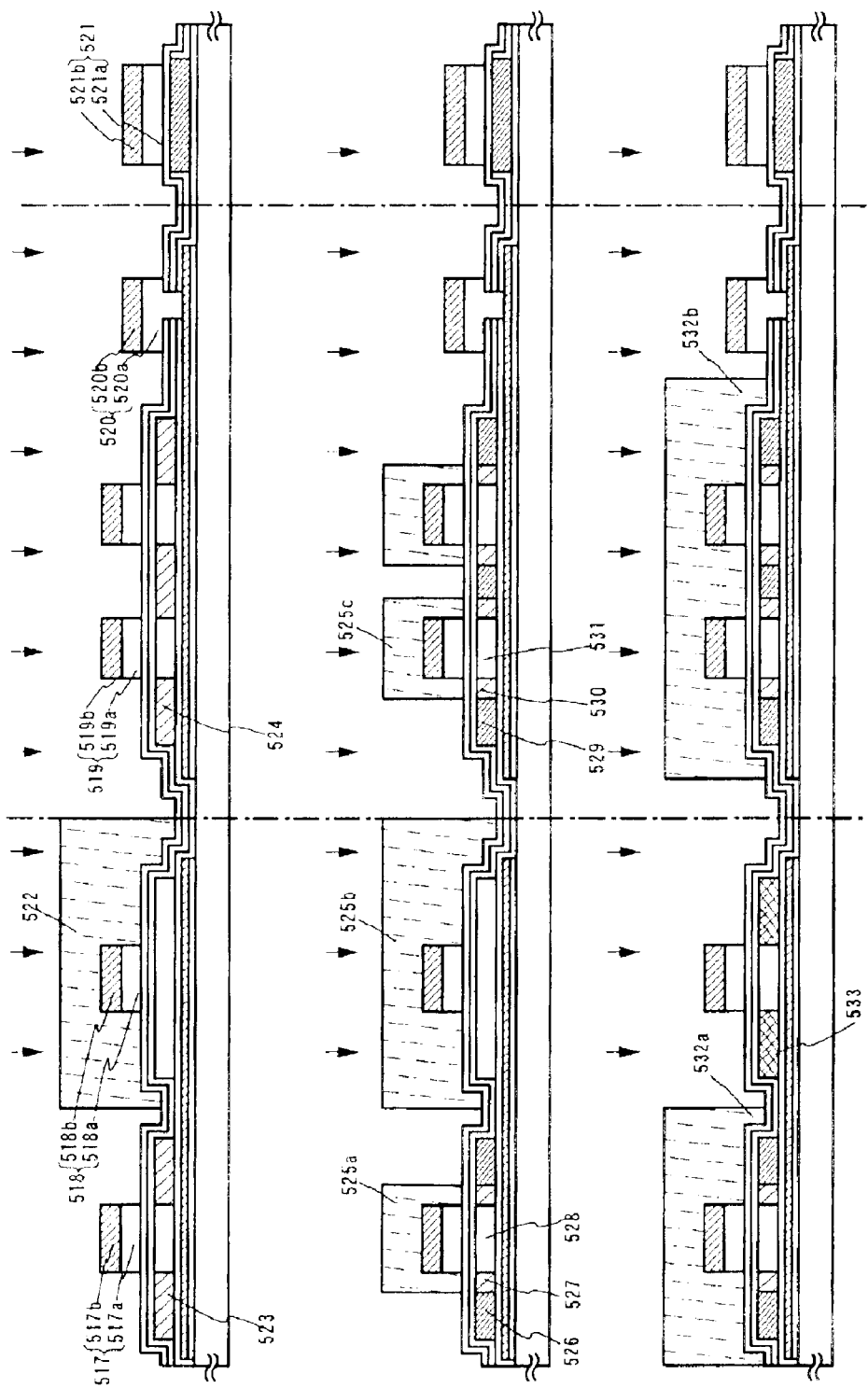

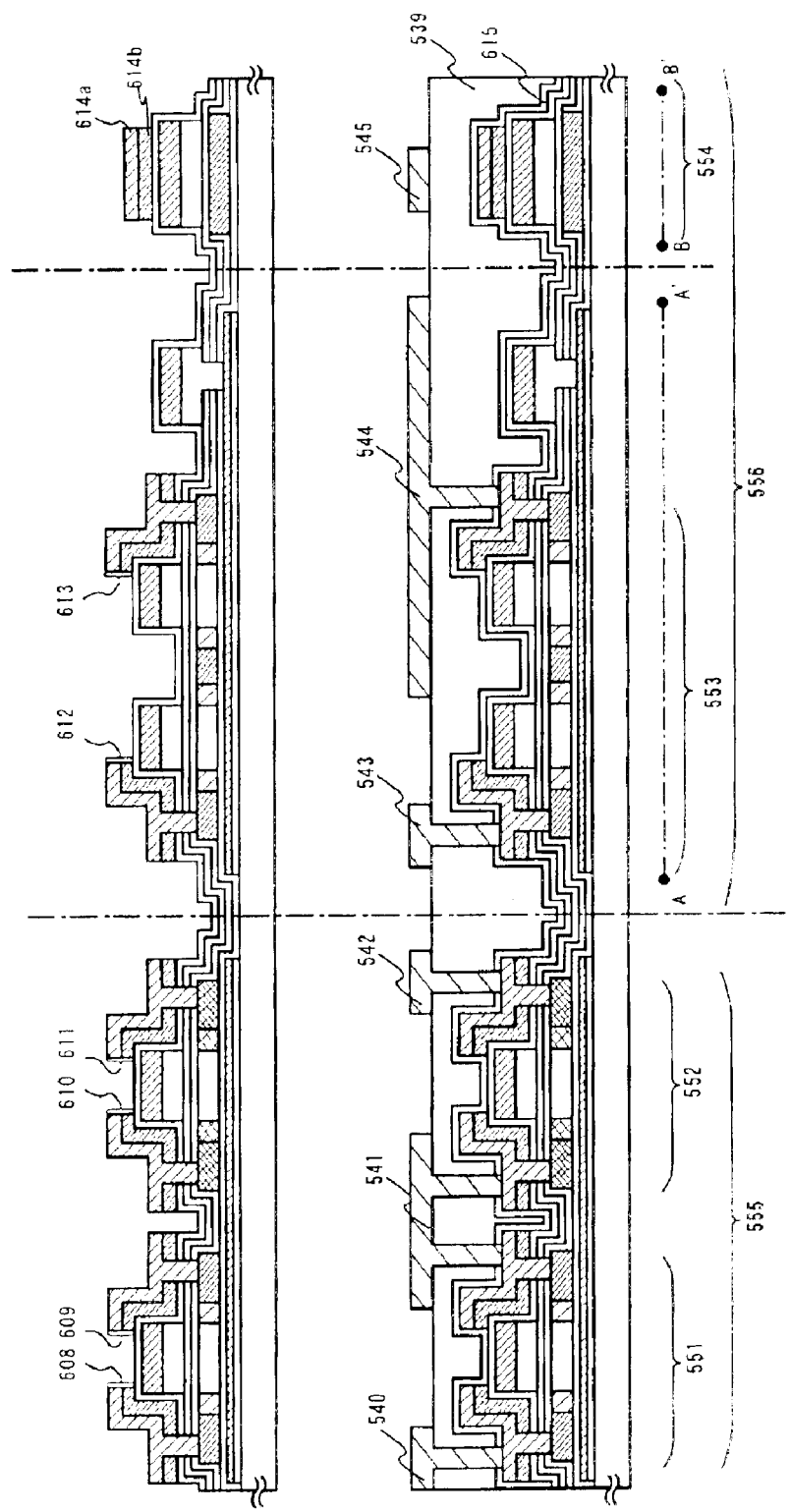

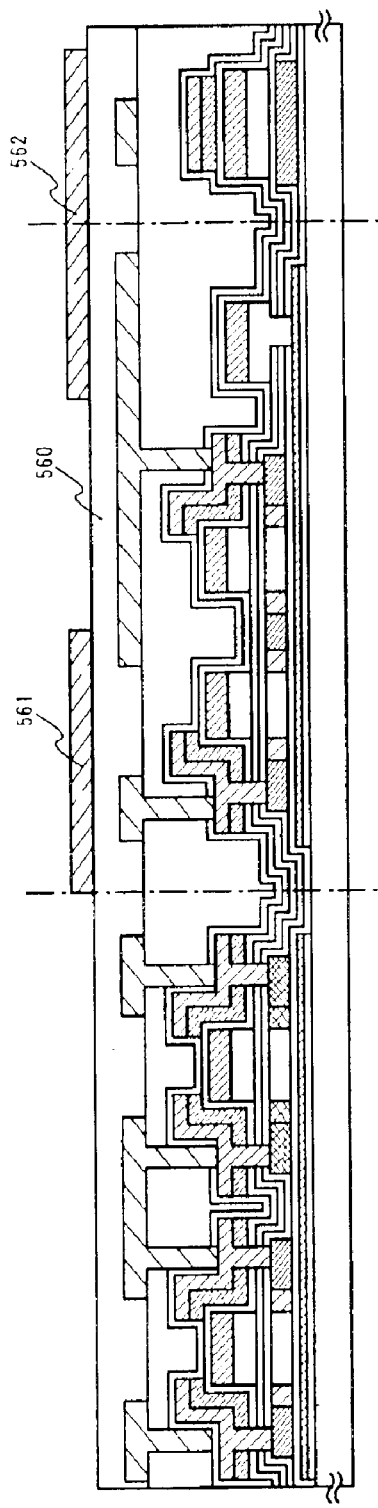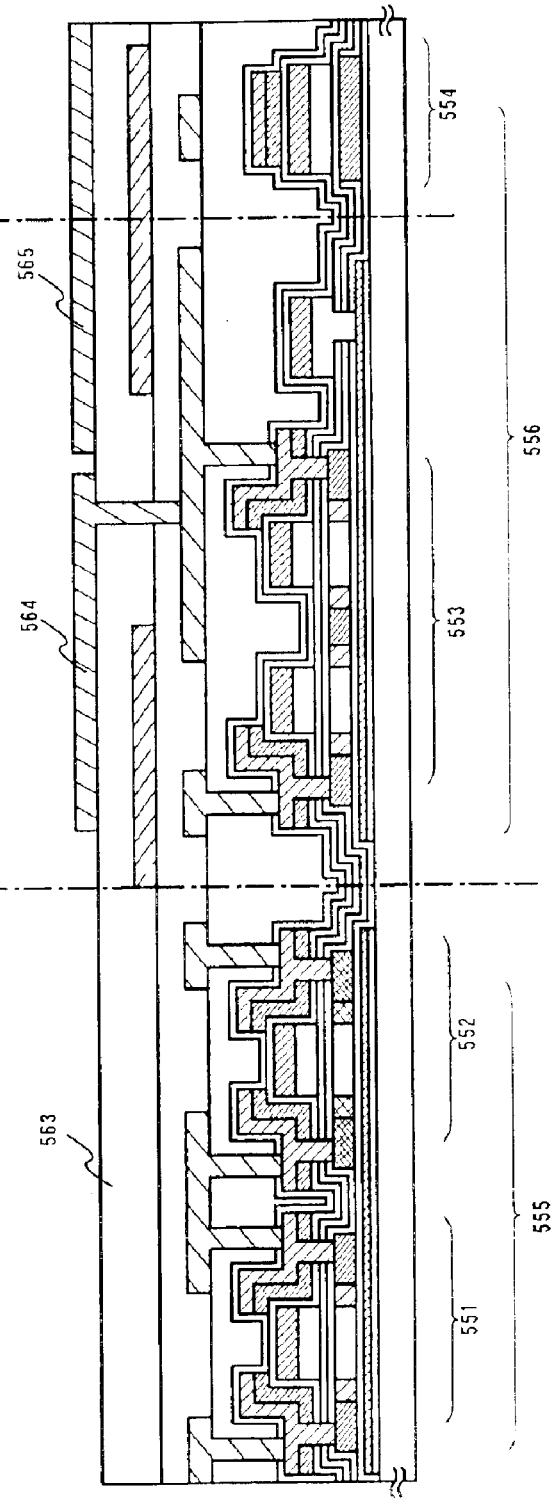
Fig.8A
Fig.8B

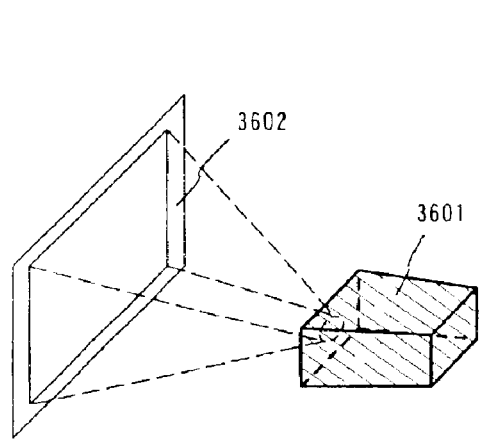
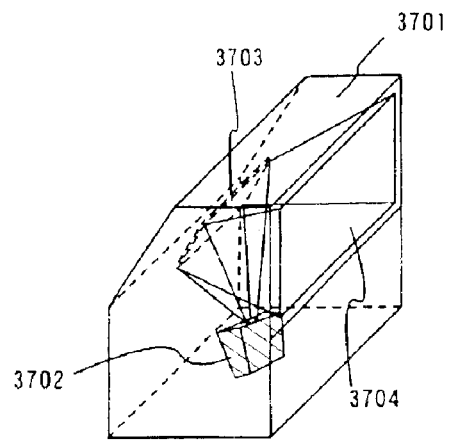
Fig. 13A
Fig. 13B
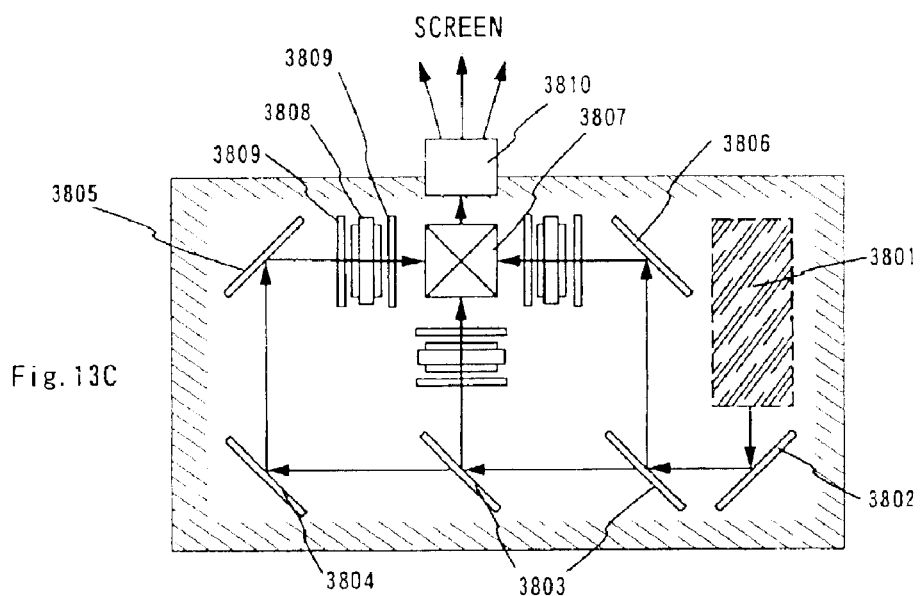
Fig. 13C
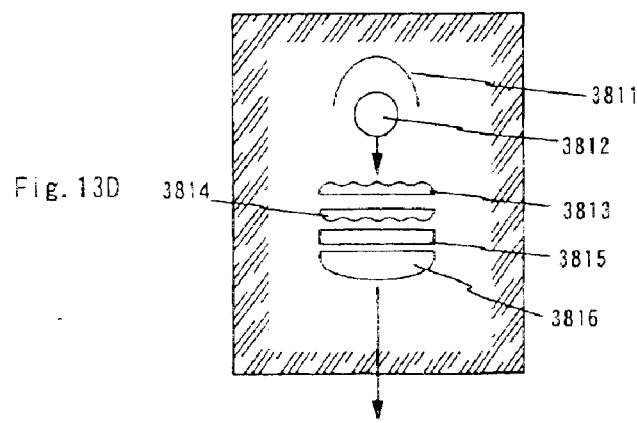
Fig. 13D

SEMICONDUCTOR DEVICE HAVING A BUFFER LAYER AGAINST STRESS

BACKGROUND OF THE INVENTION

1. Field of the Invention

This invention relates to a semiconductor device including a thin film transistor (hereinafter referred to as TFT) and a capacitor, and a method for preparing the same. This invention also relates to electronic equipment on which a display device having a semiconductor device including a TFT and a capacitor, particularly a liquid crystal display device, an EL display device or a projector, is incorporated as its component, and a method for preparing the same. In this specification, a semiconductor device means any device that can function by using semiconductor characteristics, and all of a display device, a semiconductor circuit and electronic equipment are semiconductor devices.

2. Description of the Related Art

Recently, development of a semiconductor device having an integrated circuit that is formed by a TFT constructed by using a thin film (with a thickness of approximately several nm to several hundred nm) formed on a substrate with an insulating surface is in progress. As a typical example of this, an active-matrix liquid crystal display device is known. Particularly, a TFT using a crystalline silicon film as an active region has high field-effect mobility and therefore can form various functional circuits.

For example, in an active-matrix liquid crystal display device, a pixel circuit for performing image display by each functional block and driving circuits for controlling the pixel circuit such as a shift register circuit, a level shifter circuit, a buffer circuit and a sampling circuit, which are based on CMOS circuits, can be formed on a single substrate, and the circuits can be formed by TFTs.

Semiconductor devices represented by an active-matrix liquid crystal display device are used in more and more occasions and convenience of such devices is demanded accordingly. Development to realize miniaturization, higher brightness, higher definition, lower price and the like has been continued.

For example, an active-matrix liquid crystal display device used for a liquid crystal projector or a display unit of electronic equipment has millions of pixels, and a TFT is provided in each pixel. Counter-electrodes are provided on facing substrates holding liquid crystal between them, thus forming a kind of capacitor with the liquid crystal functioning as a dielectric. Next, with the switching function of the TFTs, electric charges accumulated in the capacitor are controlled. The electronic potential to be applied to the pixels is thus controlled and the liquid crystal is driven. The amount of transmitted or reflected light is controlled to display an image.

Particularly in a small-sized and high-definition transmission-type liquid crystal display device such as one used in a liquid crystal projector, as long as miniaturization and higher definition are demanded at the same time, continuous reduction in pixel size is fully anticipated. For example, to realize high-definition display of XGA (1024× 768 pixels) in a liquid crystal display device of 0.7-inch diagonal type, each pixel has a very small area of 14 $\mu$m by 14 $\mu$m.

In the transmission-type liquid crystal display device, if sufficient capacitance is to be secured by forming a capacitor using a capacitance wiring in a pixel unit, the opening rate must be sacrificed. Currently, these problems are dealt with by increasing the opening rate for higher brightness and increasing the number of pixels for higher definition. However, it is an extremely difficult problem to design a pixel structure that can achieve both improvement in opening rate and increase in number of pixels and can secure sufficient capacitance while the pixel size becomes smaller.

As solutions for the foregoing problem, improvements are made in order to increase the opening rate, such as reduction in area of the TFT and the capacitor, which are dead spaces, reduction in width of the gate electrode and the source wiring, and reduction of the bonding margin between the TFT substrate and the facing substrates. Particularly, using a stack capacitor to reduce the area of the capacitor is effective as the foregoing solution. (Patent Literature 1)

A stack capacitor is a capacitor having a structure in which three or more layers of capacitance electrodes are stacked via two or more layers of dielectrics. Although only a structure with three layers of capacitance electrodes will be described in this specification, the stack capacitor is not limited to this structure and may have more capacitance electrodes. This specification mainly describes the case where a first capacitance electrode is formed simultaneously with a semiconductor layer of a TFT, a second capacitance electrode is formed simultaneously with a gate electrode, and a dielectric layer separating the two capacitance electrodes is a gate insulating film. However, the stack capacitor is not necessarily limited to this structure.

FIGS. 2A to 2E show a conventional method for preparing a stack capacitor. Using known techniques for patterning and etching, a semiconductor film formed on an insulating film 11, which is formed on a substrate 10, is selectively etched to form a semiconductor layer 14 including source and drain regions 16 of a TFT and a first capacitance electrode 15 of a stack capacitor. After that, an insulating film 13 to be a first dielectric is formed. Next, a gate electrode 32 and a second capacitance electrode 33 are formed. The second capacitance electrode 33 is a capacitance wiring with its electric potential fixed to ground potential or the like. After that, a second insulating film 34 to be a second dielectric is formed (FIG. 2A).

After a part of the first insulating film and the second insulating film is etched to form a contact hole 40, a second conductive film 35, which is to be a source electrode and a drain electrode as connection wirings and a third capacitance electrode, is formed to be connected with the semiconductor film 14 of the TFT (FIG. 2C).

Subsequently, the second conductive film is etched to form a source electrode, a drain electrode 41 and a third capacitance electrode 42, and then a third insulating film 36 is formed to cover the source electrode, the drain electrode, the second insulating film and the third capacitance electrode (FIG. 2D). After that, a part of the third insulating film is etched to form a contact hole that reaches the source electrode and the drain electrode, and then a third conductive film is formed and selectively etched to form a connection wiring 38 (FIG. 2E). Although not shown in FIGS. 1A to 1E, the first capacitance electrode 15 and the third capacitance electrode 42 are electrically connected with each other and are connected with the other wirings or TFT so as to be given a predetermined voltage.

In the capacitor, it is possible to hold more capacitance charges by reducing the thickness of the dielectric.

However, if the thickness of the dielectric is reduced, when forming the subsequent conductive film by a sputtering method, the dielectric is affected by the shock of sputtering and a defect tends to occur in the dielectric. Specifically, when forming the second capacitance electrode 33 and the third capacitance electrode 42, a defect occurs in the first dielectric 13 and the second dielectric 34 which are in contact with these electrodes. As a result, a short circuit may occur between the first capacitance electrode 15 and the second capacitance electrode 33 or between the second capacitance electrode 33 and the third capacitance electrode 42.

As the second conductive film 35 is formed on the insulating film 34, which is a dielectric, there arises a problem that the semiconductor film 14 of the TFT and the first capacitance electrode 15 are cracked by the stress of the conductive film 35.

To solve this problem, it may be considered to use a material that does not apply excessive stress to the substructure when forming the second conductive film. In this case, however, the material of the second conductive film is limited. For example, the case of using, as the second conductive film 35, a semiconductor film fed with phosphorus as an impurity element will be described. The semiconductor film fed with phosphorus and a semiconductor film forming an n-channel TFT can be electrically connected with each other. However, in the case of a semiconductor film forming a p-channel TFT, pn junction is generated and continuity cannot be achieved. Therefore, in the capacitance electrode of the n-channel TFT and the capacitance electrode of the p-channel TFT, conductive films made of different materials must be formed. This causes a problem of increased number of process steps.

Patent Literature 1:
JP-A-5-243519 (Pages 2 to 3, FIG. 1)

SUMMARY OF THE INVENTION

In view of above-mentioned problems, the present invention has, with respect to the semiconductor device having TFTs and a plurality of capacitance elements, an object of manufacturing a semiconductor device with a sufficient yields that has higher open ratio and a capability of higher-luminance and higher-definition display in comparison with conventional devices.

The present invention is characterized in that a semiconductor device that has a plurality of capacitance elements stacked vertically on an insulating surface, a thin film transistor, and a buffer layer formed between dielectric materials of a capacitance element and a capacitance electrode.

Therefore, the present invention is characterized in that a semiconductor device comprising a thin film transistor, a first capacitor and a second capacitor formed on an insulating surface, the first capacitor and the second capacitor being stacked vertically to the insulating surface, the first capacitor having a first capacitance electrode and a second capacitance electrode formed with a first dielectric between them, the second capacitor having the second capacitance electrode and a third capacitance electrode formed with a second dielectric between them, the thin film transistor having an active region formed by a semiconductor film, a gate electrode, a connection wiring connecting to the active region, and a first insulating film formed between the gate electrode and the connection wiring, wherein a buffer layer is formed between the second dielectric and the third capacitance electrode and between the first insulating film and the connection wiring.

The buffer layer is a film to relax stress generated when forming the third capacitance electrode and the connection wiring. The buffer layer is typically made from a crystalline semiconductor film or an amorphous semiconductor film to have a thickness of 10 to 100 nm.

The buffer layer is not in contact with the active region of the thin film transistor. The connection wiring is a source electrode and a drain electrode, and connected with the active region of the thin film transistor.

The present invention is characterized in that a method for preparing a semiconductor device comprising a first capacitor having a first capacitance electrode and a second capacitance electrode formed on an insulating surface, a second capacitor having the second capacitance electrode and a third capacitance electrode, and a thin film transistor, the method comprising:

forming a semiconductor film on an insulating surface and then etching the semiconductor film to form an active region of the thin film transistor and the first capacitance electrode;

sequentially forming a first insulating film and a first conductive film on the active region and the first capacitance electrode;

etching the first conductive film to form a gate electrode of the thin film transistor and the second capacitance electrode;

then forming a third insulating film and a second conductive film and etching the second conductive film, the third insulating film and the second insulating film to expose a part of the active region of the thin film transistor;

then forming a third conductive film and connecting the third conductive film with the active region of the thin film transistor;

etching the second conductive film and the third conductive film to form a connecting wiring of the thin film transistor and the third capacitance electrode.

BRIEF DESCRIPTION OF THE DRAWINGS

FIGS. 3A to 3C are cross-sectional views showing a process of preparing a pixel TFT and a TFT of a driving circuit.

FIGS. 4A to 4C are cross-sectional views showing a process of preparing a pixel TFT and a TFT of a driving circuit.

FIGS. 5A to 5C are cross-sectional views showing a process of preparing a pixel TFT and a TFT of a driving circuit.

FIGS. 7A and 7B are cross-sectional views showing a process of preparing a pixel TFT and a TFT of a driving circuit.

FIGS. 8A and 8B are cross-sectional views showing a process of preparing a pixel TFT and a TFT of a driving circuit.

FIGS. 13A to 13D show examples of electronic equipment.

DESCRIPTION OF THE PREFERRED EMBODIMENTS

Figure 1A:
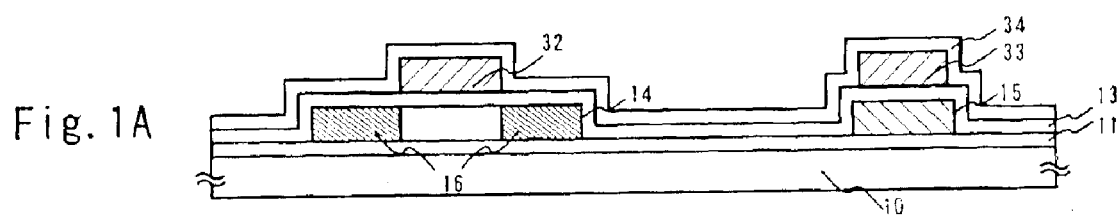
FIGS. 1A to 1E show an example of the concept of this invention.

A process of preparing a semiconductor device that can be prepared by this invention will now be described with reference to FIGS. 1A to 1E.

An underlying insulating film 11 is formed on a substrate 10. As the substrate 10, a glass substrate, a synthetic quartz glass substrate, a silicon substrate, or a metal substrate or stainless steel substrate with an insulating film formed on its surface may be used. A plastic substrate durable to the processing temperature may also be used. As the underlying insulating film 11, an insulating film such as a silicon oxide film, a silicon nitride film or a silicon oxide-nitride film is used. Although a single-layer structure is used for the underlying insulating film 11 in this embodiment, a structure having two or more stacked layers of insulating films may be used. The underlying insulating film 11 is for restraining diffusion of impurity elements from the substrate. Therefore, when a quarts glass substrate or the like is used as the substrate, the underlying insulating film need not be formed.

Next, a semiconductor film is formed on the underlying insulating film. After the semiconductor film is formed with a thickness of 25 to 200 nm (preferably 30 to 100 nm) by a known technique (sputtering method, LPCVD method, plasma CVD method or the like), the semiconductor film is etched into a desired shape to form an active region 14 of a TFT and a semiconductor film 15 to be a first capacitance electrode of a capacitor. Although the semiconductor film for the active region of the TFT and the semiconductor film for the capacitor are separately formed in FIGS. 1A to 1E, these films may remain connected instead of being separated. Moreover, while in FIG. 1A the first capacitor is a conductive film formed by adding impurity to the semiconductor film, the first capacitor is not limited to this. That is, any conductive film may be used.

In the case the semiconductor film formed by a known technique has an amorphous structure, it is desired to first perform known crystallization processing (laser crystallization method, thermal crystallization method, or thermal crystallization method using a catalyst such as nickel) to form a crystalline semiconductor film and then etch the semiconductor film into a desired shape. Although the material of the semiconductor film is not limited, silicon, silicon-germanium (SiGe) alloy or the like is preferred.

Next, a first insulating film 13 covering the semiconductor films 14 and 15 is formed. The first insulating film functions as a gate insulating film. The first insulating film is formed with a single-layer or multilayer structure of insulating films having a thickness of 40 to 150 nm by a known technique (plasma CVD method, sputtering method or the like).

Next, a first conductive film is formed using a known technique and the first conductive film is selectively etched to form a gate electrode 32 and a second capacitance electrode 33. The second capacitance electrode becomes a capacitance wiring with its electric potential fixed to ground potential or the like. The material of the first conductive film is an element selected from Ta, W, Ti, Mo, Al and Cu, or an alloy material or compound material containing these elements as principal components. A semiconductor film represented by a crystalline silicon film doped with an impurity element such as phosphorus may also be used. While the first conductive film has a single-layer structure in this embodiment, two or more layers of conductive films may be stacked.

Next, a second insulating film 34 is formed to cover the gate electrode 32 and the second capacitance electrode 33. The second insulating film 34 is formed with a single-layer or multilayer structure having a thickness of 40 to 150 nm by a known technique (plasma CVD method, sputtering method or the like).

Next, using the gate electrode 32 as a mask, the semiconductor film 14 is selectively fed with an impurity element to form an impurity region 16. As the impurity element, an impurity element providing n-type or an impurity element providing p-type is used. FIG. 1A shows an example of feeding p-type impurity. Subsequently, heat treatment is performed to activate the impurity element (FIG. 1A).

Figure 1B:
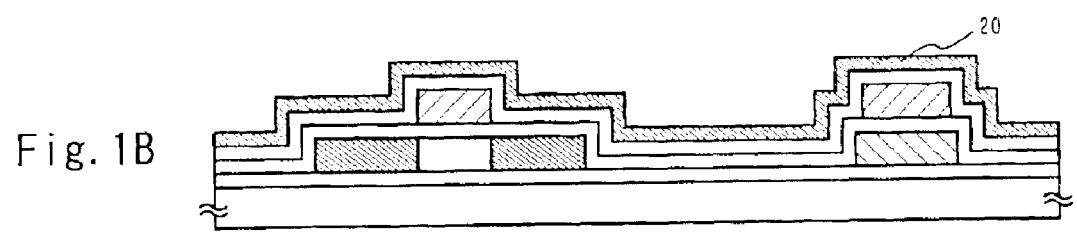

Next, a second conductive film 20 is formed on the second insulating film 34 (FIG. 1B). FIG. 1B shows the case of stacking two layers of conductive films. A buffer layer (second conductive film 20 formed on the second insulating film 34 in FIG. 1B) is formed to relax the stress applied from an upper conductive film 21, which will be formed later. Therefore, the second conductive film is formed using a material that can relax the stress. For example, a crystalline silicon film with phosphorus added thereto is electrically conductive, can be formed by an LPCVD method with good step coverage and is more flexible than a metal element film. Therefore, it can relax the stress applied to the second insulating film 34 by the upper conductive film 21. Although a crystalline silicon film with phosphorus added thereto is used as the second conductive film in FIG. 1B, the second conductive film is not limited to this and an amorphous silicon film can also be used. Moreover, an organic conductive material (such as polyphenylene vinylene derivative, polyfluorene derivative, polythiophene derivative, polyphenylene derivative and copolymer of these, oligophenylene, oligothiophene, pentacene, tetracene, copper phthalocyanine, fluorine-substitute phthalocyanine, perylene derivative or the like) can also be used. In FIGS. 1A to 1E, the impurity-added regions (source region and drain region) of the TFT are of p-type, but the second conductive film 20 is a crystalline silicon film with phosphorus added thereto and is an n-type semiconductor. Therefore, the second conductive film and the impurity-added regions of the TFT cannot be directly connected with each other. Therefore, the second conductive film is formed before opening a contact hole directly connecting the second conductive film with the semiconductor film of the TFT.

Next, etching processing to form a contact hole reaching the semiconductor film 14 is performed. The etching processing is performed under the following first to third etching conditions. Of course, when the same material is stacked, etching can be performed under the same condition. Even with different materials, etching can be performed under the same condition in some cases. Under any etching condition, it is desired to perform etching using a dry etching method such as an RIE (reactive ion etching) method or an ECR (electron cyclotron resonance) method. This is because anisotropic etching can be performed more easily by dry etching than by wet etching.

First, under the first etching condition, the second conductive film 20 is partly etched to partly expose the second insulating film 34. Next, a mask made of a resist is kept in that state and the second insulating film 34 is etched under the second etching condition to partly expose the first insulating film 13. Moreover, the first insulating film 13 is etched under the third etching condition to expose a part of the semiconductor film 14. By the processing as described above, a contact hole reaching the semiconductor film 14 is formed.

Figure 1C:
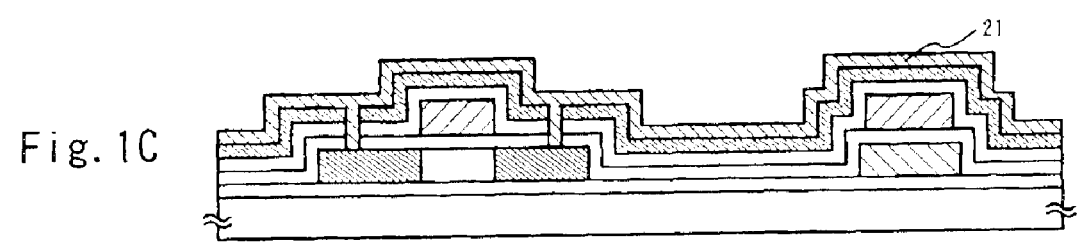

Next, a third conductive film 21 is formed on the second conductive film 20. It is desired that the third conductive film 21 is a metal element film so that the third conductive film 21 can be connected with both the p-type impurity region and the n-type impurity region of the TFT. It is also desired that the third conductive film 21 is a film made of a material less reactive to the semiconductor film of the TFT. Typically, a metal element film containing an element such as Ta, W, Ti, Mo, Al, Cu, Cr or Nd can be used. In this embodiment, a tungsten film is formed (FIG. 1C).

Figure 1D:
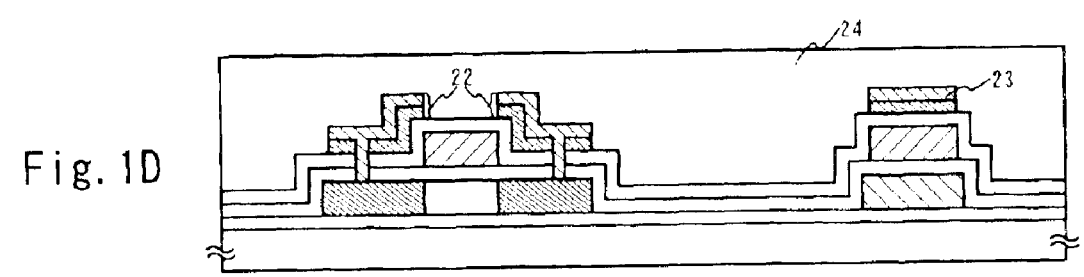
Figure 1E:
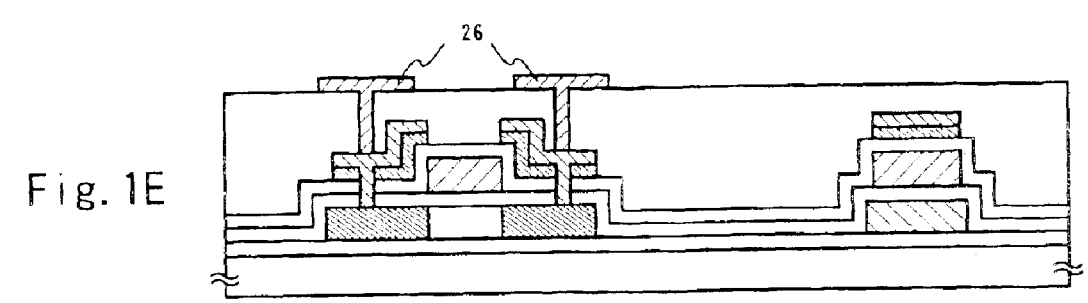
Figure 2A:
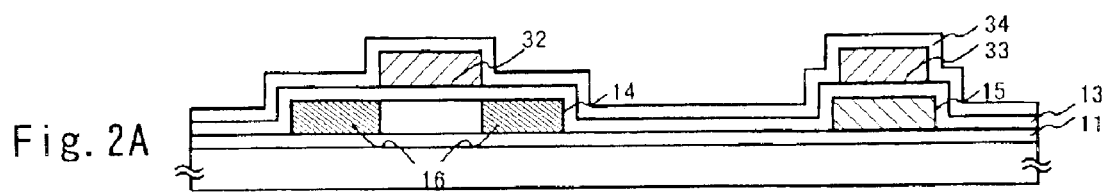
FIGS. 2A to 2E show a conventional example.
Figure 2B:
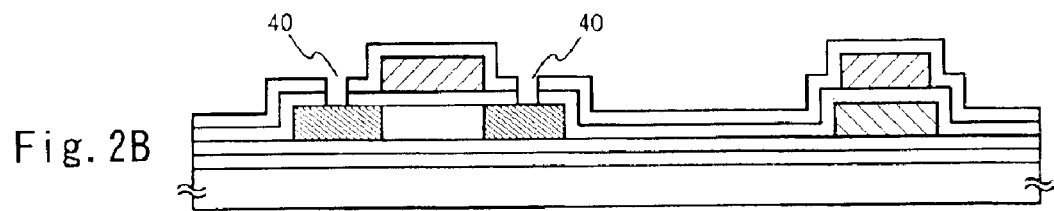
Figure 2C:
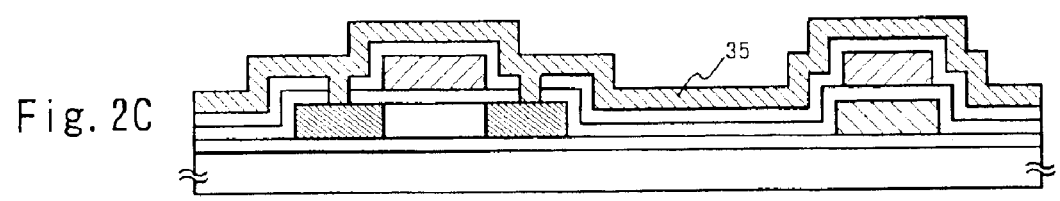
Figure 2D:
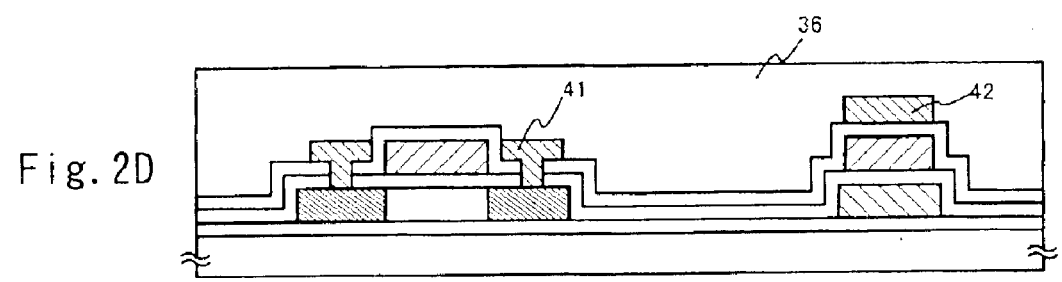
Figure 2E:
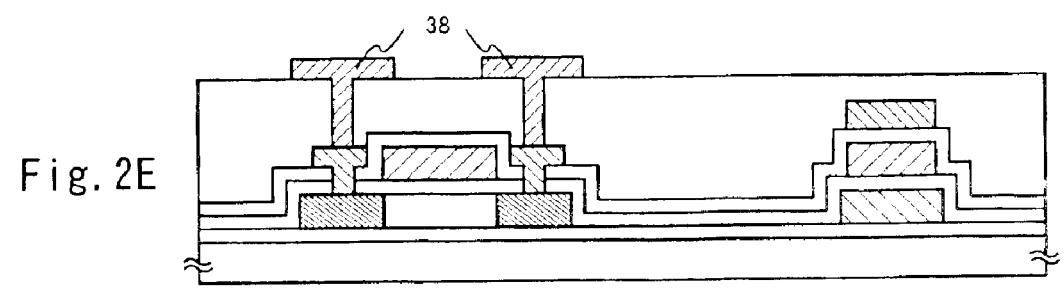

Next, the second conductive film 20 and the third conductive film 21 are selectively etched to form a source electrode and a drain electrode 22, which are connection wirings of the TFT, and a third capacitance electrode 23. After that, a third insulating film 24 is formed. Since the etching in forming the source electrode, the drain electrode 22 and the third capacitance electrode is etching before flattening the step of the gate electrode, isotropic etching is desired. A crystalline silicon film with tungsten and phosphorus added thereto is a material that enables isotropic etching. It is preferred that the source electrode and the drain electrode are formed to cover a part of the top of the gate electrode. With this structure, incidence of stray light (light that is not shut out by a shade film formed above the TFT) on the semiconductor film of the TFT can be restrained and an OFF-state current of the TFT can be restrained (FIG. 1D). The second conductive film is provided as a buffer layer. Since the second conductive film is electrically conductive, it also functions as a capacitance electrode similar to the third capacitance electrode 23.

After the third insulating film 24 is formed, the third insulating film 24 is partly etched to form a contact hole, exposing the source electrode and the drain electrode 22 of the TFT. After that, a fourth conductive film 26 is formed. As the material of the fourth conductive film, aluminum (Al), titanium (Ti), tungsten (W), copper (Cu) or the like can be used. Alternatively, a multilayer structure having Al or Cu formed on a TaN film and having a Ti film formed thereon may be used.

Although not shown, the semiconductor film 15 and the third capacitance electrode 23 of the stack capacitor are electrically connected with each other and are given a predetermined electric potential.

Through the above-described process, it is possible to form a TFT and a stack capacitor at the same time. The stack capacitor includes a first capacitor and a second capacitor, with the second capacitor stacked on the first capacitor. Specifically, the first capacitor includes a first capacitance electrode and a second capacitance electrode formed with a first dielectric between them, and the second capacitor includes the second capacitance electrode and a third capacitance electrode formed with a second dielectric between them. In this embodiment, since the first capacitor and the second capacitor are stacked, it is possible to secure sufficient capacitance charges while reducing the area of the capacitors.

Moreover, since the second conductive film 20 as a buffer layer is formed between the second insulating film 34 and the third conductive film 21, the second insulating film 34 can be protected from the sputtering shock generated when forming the third conductive film 21 and therefore the thickness of the second insulating film 34 can be reduced. As a result, it is possible to maintain sufficient capacitance charges without enlarging the surface area of the dielectric.

As the second conductive film is provided, the stress generated when forming the third conductive film 21 can be relaxed. Therefore, cracking of the semiconductor film due to the stress can be restrained and improvement in yield can be realized.

Furthermore, the second conductive film is not directly connected with the semiconductor film of the TFT. Therefore, an n-type semiconductor film and a p-type semiconductor film can be used for the second conductive film. That is, the polarity of the second conductive film need not be adjusted in accordance with the n-channel TFT and the p-channel TFT and the buffer layer can be formed by a minimum number of process steps.

As this invention is applied to a projection-type liquid crystal display device such as a projector, the opening rate of pixels can be increased. As a result, display with high-luminance and high definition can be provided and the display device can be produced at a high yield.

This invention having the above-described structure will now be described further in detail with reference to the following examples.

[Embodiment 1]

A method of manufacturing an active matrix substrate is described in this embodiment using FIGS. 3A to 10. A substrate on which a driver circuit used for a CMOS circuit, and a pixel portion having a TFT pixel and a capacitance element are formed together is referred to as an active matrix substrate for convenience.

First, a first base film (not shown) that is made from a silicon oxide film, a silicon nitride film, or a silicon oxynitride film is formed to have a thickness of 10 to 150 nm (preferably 50 to 100 nm) on a substrate 500. The base film may have a laminated structure having two or more layers, or not be formed. Next, a conductive film that is made from conductive materials such as Ta, W, Cr, Mo, Si or the like having a resistance to the processing temperatures used in this embodiment is formed and shaped in a desired shape. Subsequently, a bottom shielding film is formed. The bottom shielding film has a function of a gate wiring. In this embodiment, a crystal silicon film in 85 nm thick is formed, then, tungsten silicide ($Wsi_x$(x=2.0 to 2.8)) in 170 nm thick is formed, and then, bottom-shielding films 501, 502 are formed by etching unnecessary portions. In this embodiment, a laminated film including two layers is used for the bottom shielding film, however, a single layer film may also be used.

In this embodiment, a synthetic quart glass substrate is used for forming a substrate 500. Glass substrates such as barium borosilicate glass or aluminum borosilicate glass typically Corning Corp., #7059 glass and #1737 glass, silicon substrates, metallic element substrates, or stainless steel substrates formed an insulating films thereon may be used in this embodiment. Further, a plastic substrate having a resistance to the processing temperatures used in this embodiment may also be used.

A second base film 503 having a thickness of 10 to 650 nm (preferably 50 to 600 nm) made from an insulating film such as a silicon oxide film, a silicon nitride film, silicon oxynitride film or the like is formed on the substrate 500 and bottom shielding films 501, 502. In this embodiment, a single layer film is used for the second base film 503, however, a laminated film including two insulating films may also be used. As the second base film 503, a silicon oxynitride film is formed to have a thickness of 100 nm (composition ratio Si=32%, O=27%, N=24% and H=17%) with a plasma CVD method using $SiH_4$, $NH_3$, and $N_2O$ as reaction gas.

Next, a semiconductor layer 504 is formed on the second base film 503. First of all, the semiconductor film 504 is formed to have a thickness of 25 to 200 nm (preferably 30 to 100 nm) by a known method (such as the sputtering method, the LPCVD method, and the plasma CVD method). There is no limitation of materials for semiconductor film though, it is preferable to use silicon or silicon germanium (SiGe) for forming the semiconductor film. (FIG. 3A)

Then, the semiconductor film is crystallized by using a known crystallization method (a laser crystallization, a thermal crystallization, and a thermal crystallization using catalyst such as nickel). In this embodiment, for crystallizing the semiconductor film, a nickel acetate solution containing 5 ppm of nickel by weight is applied onto the whole surface by spin coating, and exposed in a nitrogen atmosphere for twelve hours at a temperature of 600° C. (FIG. 3B)

In case of applying a laser crystallization for crystallizing an amorphous semiconductor film, an excimer laser of a pulse oscillation type or a continuous emission type, a YAG laser, a YLF laser, a $YVO_4$ laser, a $YAlO_3$ laser or the like can be employed. In case of employing such lasers, a method is recommended wherein a laser beam emitted from a laser oscillator is condensed into the shape of a line by an optical system so as to irradiate the semiconductor film. The conditions of the crystallization shall be properly chosen by a person who operates the process. In the case of employing the excimer laser, it is allowed to set a pulse oscillation frequency at 300 Hz and a laser energy density at 100 to 800 $mJ/cm^2$ (typically, 200 to 700 $mJ/cm^2$). Besides, in the case of employing the YAG laser, it is allowed to utilize the second higher harmonics of the emitted laser beam and to set a pulse oscillation frequency at 1 to 300 Hz and a laser energy density at 300 to 1000 $mJ/cm^2$ (typically, 350 to 800 $mJ/cm^2$). Herein, the whole surface of the substrate may be irradiated with the laser beam condensed in the shape of the line having a width of 100 to 1000 μm, for example, 400 μm, and the overlap percentage of such rectilinear laser beams on this occasion may be set at 50 to 98%.

Subsequently, gettering is conducted to remove or reduce the metal element used in accelerating the crystallization from a semiconductor film for an active region. As for gettering, a method may be applied that is disclosed in Japanese Patent Laid-open No. 10-270363. In this embodiment, as a mask, a silicon oxide film having a film thickness of 70 nm is formed, then, carried out etching thereon. Thus, silicon oxide films 508a to 508d can be obtained in a desired form. Ar is selectively introduced to the semiconductor film to form impurity regions 510a to 510f. By carrying out a thermal process, the metal element can be reduced from the semiconductor films 511a to 511d used for an active region to an extent of less affecting the semiconductor characteristic. The metal element removed from the semiconductor films 511a to 511d is etched and removed together with the impurity regions 510a to 510f at the following steps. The TFT having an active region formed by this means has a lowered off-current value and is improved crystallinity, in consequence, the TFT can provide high field-effect mobility and attain a favorable current voltage characteristic. (FIG. 3C)

Then, a crystalline semiconductor film is etched to form 511a to 511d into desired form semiconductor films. The detailed process is not shown. Further, after the semiconductor films 511a to 511d is formed, trace amounts of impurity elements (boron or phosphorus) may be doped thereon to control a threshold value of TFT.

Then, a first insulating film 512 is formed covering the semiconductor films 511a to 511d. (FIG. 4A) The first insulating film 512 is formed by an insulating film containing silicon to have a thickness of 20 to 150 nm by using a plasma CVD or sputtering. In this embodiment, a silicon oxynitride film is formed (composition ratio: Si=32%, O=59%, N=7%, H=2%) to have a thickness of 35 nm by a plasma CVD. Of course, the gate insulating film is not limited to use a silicon oxide nitride film but may use another insulating films.

Besides, in case of employing a silicon oxide film for the first gate insulating film 512, it can be formed by the plasma CVD in such a way that TEOS (Tetraethyl Orthosilicate) and $O_2$ are mixed, and that electric discharge is induced under the conditions of a reaction pressure of 40 Pa, a substrate temperature of 300° C. to 400° C. and a radio-frequency (13.56 MHz) power density of 0.5 to 0.8 $W/cm^2$. The silicon oxide film thus formed is thereafter subjected to thermal annealing at 400° C. to 500° C., that causes characteristics favorable as the gate insulating film can be attained.

The gate insulating film is partly etched, then, the semiconductor film 511d used for one capacitance electrode is exposed, and then, impurity elements are introduced into the semiconductor film 511d, accordingly, a first capacitance electrode is formed. (FIG. 4B). At this time, impurity elements are not introduced into other regions since the regions are covered by a resist 513. In this embodiment, a doping process is carried out in the condition that P (phosphorus) is used for impurity elements, the dosage is $5 \times 10^{14}$ $atoms/cm^2$, and an acceleration voltage is 10 keV.

Then, a second insulating film 515 is formed. The second insulating film 515 is formed from an insulating film having a thickness of 20 to 150 nm by using a plasma CVD and a sputtering. In this embodiment, a silicon oxynitride film is formed (composition ratio: Si=32%, O=59%, N=7%, H=2%) to have a thickness of 50 nm by a plasma CVD. Of course, the second insulating film is not limited to use a silicon oxynitride film but may use another insulating films.

In this embodiment, in order to form the insulating film functioning as dielectrics in the capacitance element into thinner than the gate insulating film in TFT, the gate insulating film is formed in twice though, it may also be formed in one.

Next, after contact holes connecting with the bottom shielding film is formed, a first conductive film 516a having a thickness of 20 to 100 nm and a second conductive film 516b having a thickness of 100 to 400 nm are laminated. (FIG. 4C) In this embodiment, a first conductive film 516a made from n-type crystalline silicon film having a thickness of 150 nm and a second insulating film 516b made from tungsten silicide ($WSi_x$) film having a thickness of 150 nm are laminated. The n-type crystalline silicon film is formed by a plasma CVD. The tungsten silicide ($WSi_x$) film is formed by using a target of tungsten silicide ($WSi_x$) by sputtering.

In this embodiment, the first conductive film 516a is made from n-type crystalline silicon film and the second insulating film 516b is made from tungsten silicide ($WSi_x$) film though, it is not limited to that. Either can be formed from an element selected from Ta, W, Ti, Mo, Al, Cu, Cr, and Nd, or alloy materials or compound materials that contain these elements as principle components. Otherwise, AgPdCu alloys can be used.

Then, etching is conducted in order to form a gate electrode and a second capacitance electrode. (FIG. 5A) In this embodiment, an ICP (inductively coupled plasma) etching method is used, a gas mixture of $CF_4$, $Cl_2$ and $O_2$ is used as an etching gas, the gas flow rate is set to 25:25:10 sccm, and a plasma is generated by applying a 500 W RF (13.56 MHz) power to a coil shape electrode at 1 Pa. According to the etching condition, conductive films 517 to 521 is formed. Another known etching methods such as RIE, ECR, or the like can be used for the process.

And then, a second doping is carried out to introduce an n-type imparting impurity element to the semiconductor film. Doping may be carried out by an ion doping method or an ion injecting method. The condition of the ion doping method is that a dosage is $1 \times 10^{-}$ to $5 \times 10^{14}$ atoms/cm$^2$, and an acceleration voltage is 30 to 80 keV. In this embodiment, the dosage is $1.5 \times 10^{13}$ atoms/cm$^2$ and the acceleration voltage is 70 keV. As the impurity element for imparting the n-type conductivity, an element which belongs to group 15 of the periodic table, typically phosphorus (P) or arsenic (As) is used, and phosphorus is used here. In this case, the conductive films 517 to 521 become masks to the impurity element for imparting the n-type conductivity, and low concentration impurity regions 523, 524 are formed in a self-aligning manner. The impurity element for imparting the n-type conductivity is added to the low concentration impurity regions 523, 524 in the concentration range of $1 \times 10^{18}$ to $1 \times 10^{20}$ atoms/cm$^3$. Here, a semiconductor film on which p-channel TFT is formed with a resist mask 522, and n-type impurity elements are not introduced thereinto.

As shown in FIG. 5B, a third doping is carried out. The condition of the ion doping method is that a dosage is $1 \times 10^{13}$ to $1 \times 10^{15}$ atoms/cm$^2$, and an acceleration voltage is 30 to 120 keV. Here, in order not to introduce n-type impurity elements to a semiconductor film that forms a p-channel type TFT, a mask 525b is formed. Further, in order to form selectively high concentration impurity region on a semiconductor film for forming an n-channel type TFT, masks 525a, 525c are formed. In this embodiment, the dosage is $1 \times 10^{15}$ atoms/cm$^2$ and the acceleration voltage is 40 keV. Thus, high concentration impurity regions 526, 529 are formed.

After masks made from resists are removed, masks 532a and 532b made from resists are newly patterned, and a fourth doping is carried out as shown in FIG. 5C. By the fourth doping, an impurity region introduced impurity elements for imparting p-type is formed on a semiconductor film used for an active layer of the p-channel type TFT. The second conductive film 518 is used as a mask to impurity elements to introduce impurity elements for imparting p-type, and an impurity region is formed in a self-alignment manner. In this embodiment, diborane ($B_2H_6$) is added to a semiconductor film by an ion doping to form an impurity region 533. The condition of the ion doping method is that a dosage is $1 \times 10^{13}$ to $1 \times 10^{14}$ atoms/cm$^2$, and an acceleration voltage is 30 to 120 keV. When the fourth doping is carried out, a semiconductor film that forms an n-channel type TFT is covered by masks made from resists 532a and 532b.

Figures 6A, 6B, 6C:
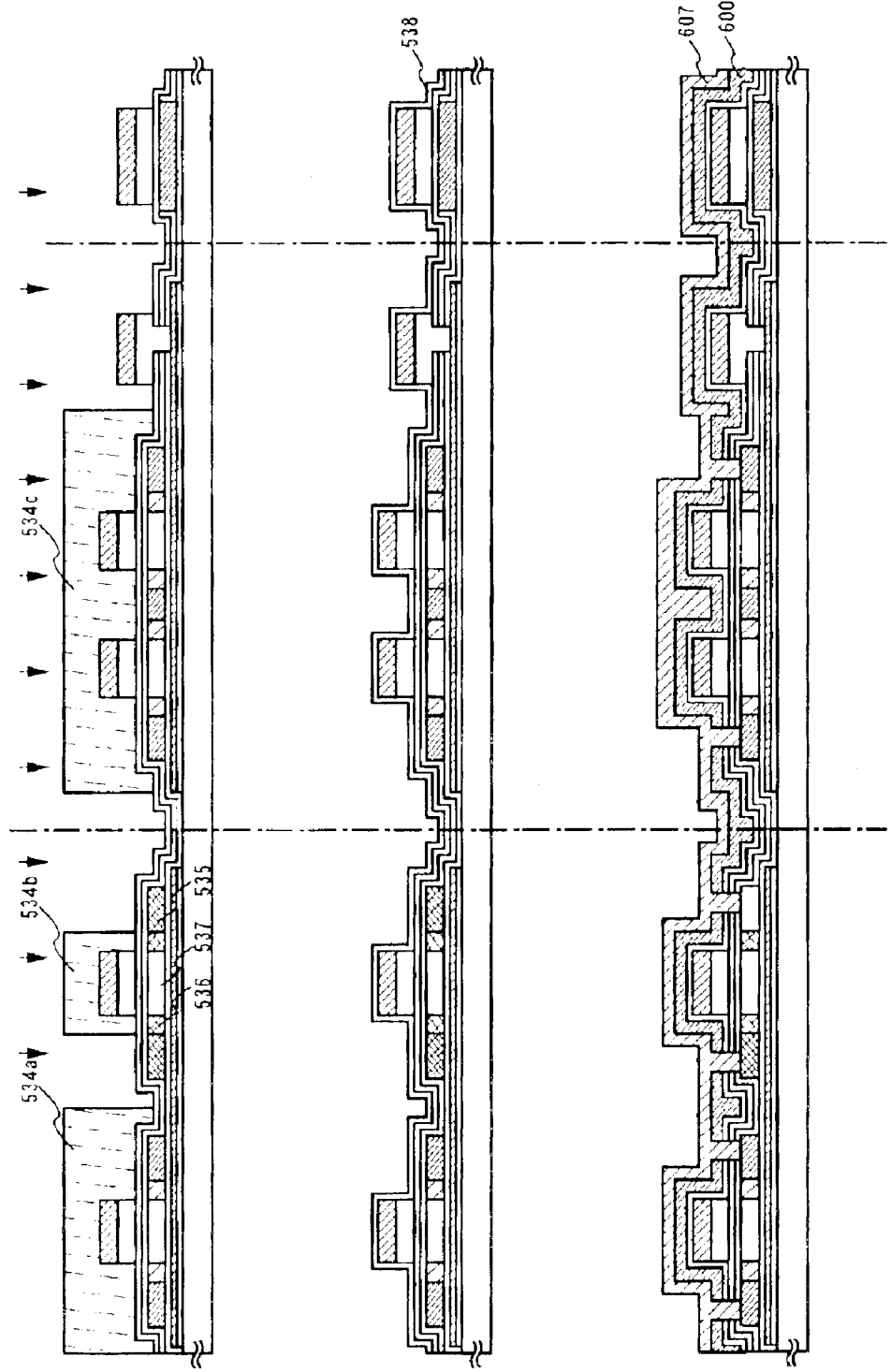
FIGS. 6A to 6C are cross-sectional views showing a process of preparing a pixel TFT and a TFT of a driving circuit.

Next, as shown in FIG. 6A, a fifth doping is carried out. The condition of an ion doping method is that a dosage is $1 \times 10^{13}$ to $1 \times 10^{15}$ atoms/cm$^2$, and an acceleration voltage is 20 to 120 keV. Here, in order not to introduce p-type impurity elements to a semiconductor film that forms a p-channel type TFT, masks 534a, 534c are formed. Further, in order to form selectively a high concentration impurity region on a semiconductor film for forming p-channel type TFT, a mask 534b is formed. In this embodiment, the dosage is $1 \times 10^{15}$ atoms/cm$^2$ and the acceleration voltage is 40 keV. Thus, a high concentration impurity region 535 and a low concentration impurity region 536 are formed.

According to above-mentioned steps, a high concentration impurity region and a low concentration impurity region are formed on each semiconductor film.

As shown in FIG. 6B, masks made from resists 534a to 534c are removed to form a first interlayer insulating film 538. The first interlayer insulating film 538 is formed to have a thickness of 100 to 200 nm by a plasma CVD or sputtering. In this embodiment, a silicon oxynitride film is formed to have a thickness of 150 nm by a plasma CVD. Of course, the first interlayer insulating film 538 is not limited a silicon oxynitride film but another insulating films such as silicon nitride film in a structure of a single layer or laminated layers.

Next, a third heat treatment is carried out to conduct a recovery of crystallinity of the semiconductor film and activation of impurity elements introduced into each semiconductor film. Here, a heat treatment is conducted using an electric furnace at 950° C. in nitride atmosphere having at most 1 ppm, preferably at most 0.1 ppm oxygen concentration for 30 minutes. Other than the heat treatment, a laser annealing or a rapid thermal annealing (RTA) can be applied. In this embodiment, the third heat treatment can be conducted at high temperature, since synthetic quartz is used for the substrate. However, in case of using glasses, plastics, or the like that have low heat resistance, the third treatment should be conducted at lower temperature than the temperature that the substrate can be resisted.

In addition, before forming the first interlayer insulting film 538, the heat treatment can be carried out. However, in the case that materials for forming the first conductive film and the second conductive film are weak against heat, it is preferable that the heat treatment is conducted after the first interlayer insulating film (insulating films having silicon in major components, a silicon nitride film for example) is formed in order to protect the first conductive film, the second conductive film, or the like as this embodiment.

Next, a hydrogenation can be conducted by carrying out a heat treatment (at 300 to 550° C. for 1 to 12 hours). This step is conducted in order to terminate a dangling bond of the semiconductor film by hydrogen included in the first interlayer insulating film 538. Further, the semiconductor film can be hydrogenated irrespective of the first interlayer insulating film presence. Another method for hydrogenation, a plasma hydrogenation (by using hydrogen by plasma) or a heat treatment in atmosphere containing hydrogen of 3 to 100% at 300 to 450° C. for 1 to 12 hours may be conducted.

Then, as shown in FIG. 6C, a third conductive film 600 is formed on the first interlayer insulating film 538. As materials for the third conductive film 600, conductive films which is typified by a crystalline silicon film doped with n-type impurity elements such as phosphorus having a thickness of 10 to 100 nm is preferable. If the thickness of the third conductive film is less than 10 nm, it has little effect in relaxing stress that is generated when a tungsten film used for the third conductive film is formed afterward. Moreover, if the thickness of the third conductive film is 100 nm or more, it is difficult to control widths of each line uniformly when a source electrode, a drain electrode, and a second capacitance electrode. In this embodiment, an n-type crystalline silicon film having a thickness of 50 nm as the third conductive film 600 by LPCVD.

Next, as shown in FIG. 6C, contact holes reaching each high concentration region of the semiconductor film of TFT. In this embodiment, an etching is conducted by RIE etching in the conditions that a gas mixture of $CF_4$, $Cl_2$, and $O_2$ is used as an etching gas, the gas flow rates are set to 25:25:10 (sccm). The etching is conducted by applying a 500 W RF (13.56 MHz) power at a 106.4 Pa voltage to the electrode.

And then, on the third conductive film 600 and the semiconductor film, a tungsten film used for a fourth conductive film 607 is formed by using a sputtering. It is preferable that the fourth conductive film is formed to have a thickness of 50 to 150 nm. It is caused by that if the thickness of the fourth conductive film is thinner than 50 nm, contact holes that will be formed later can not have a function as an etching stopper, further, if the thickness is 150 nm or more, it is difficult to control widths of each line uniformly since an isotropic etching is conducted when a source electrode, a drain electrode, and a third capacitance electrode are formed. In this embodiment, a tungsten film having a thickness of 100 nm is formed. Further, materials for the fourth conductive film 607 are not limited to tungsten. For example, it is possible that the laminated film in which an aluminum (Al) film and copper (Cu) are formed on the tantalum nitride (TaN) film, and titanium (Ti) film is formed thereon, is etched, and wirings are formed.

Next, as shown in FIG. 7A, source electrodes and drain electrodes 608 to 613 used for a connection wiring and a third capacitance electrode 614a are formed by etching selectively the third conductive film and the fourth conductive film. First, an etching is conducted by RIE etching in the conditions that a gas mixture of $SF_6$ and He is used as an etching gas, the gas flow rates are set to 20:20 (sccm). The third conductive film is conducted partly by applying a 300 W RF (13.56 MHz) power to the electrode. The third conductive 614b film conducted etching is provided as a buffer layer, however, it can function as a capacitance electrode together with the fourth conductive film, since the third conductive 614b is conductive.

As shown in FIG. 7B, a second interlayer insulating film 615 is formed. The second interlayer insulating film 615 is formed by using an insulating film having a thickness of 100 to 200 nm by plasma CVD or sputtering. In this embodiment, a silicon nitride film to have a thickness of 120 nm by a plasma CVD.

A third interlayer insulating film 539 made from inorganic insulating materials or organic insulating materials is formed on the second interlayer insulating film 615. In this embodiment, a silicon oxynitride film to have a thickness of 0.45 $\mu$m is formed.

Then, contact holes reaching the source electrodes and drain electrodes 608 to 613 are formed, and wirings 540 to 544 connecting electrically with each source electrode and drain electrodes 608 to 613 are formed.

These wirings are formed by etching a laminated film including a titanium (Ti) film having a thickness of 60 nm, a titanium nitride (TiN) film having a thickness of 40 nm, an alloy film (Al and Si alloy film) having a thickness of 300 nm, and a tungsten (W) film having a thickness of 100 nm.

As shown in FIG. 8A, a fourth interlayer insulating film 560 made from inorganic insulating materials or organic insulating materials is formed on the third interlayer insulating film 539 and wirings 540 to 544. In this embodiment, a silicon oxynitride film to have a thickness of 0.45 $\mu$m is formed.

Subsequently, a film having high light blocking effects such as Al, Ti, W, Cr, black resin, or the like is etched into a desired form to form shielding films 561, 562 on the fourth interlayer insulating film 560. The shielding films 561, 562 are arranged like the reticulation so as to shield except opening portions of pixels.

As shown in FIG. 8B, a fifth interlayer insulating film 563 is formed to overlap the shielding films 561, 562. After that, contact holes reaching a connecting wiring 544 are formed, then, a conductive film having a thickness of 100 nm is formed, and then, etched into a desired form to obtain pixel electrodes 564, 565. In this embodiment, a pixel electrode is formed by using a film made from ITO. A liquid crystal display device formed later by using this substrate is a transparent type liquid crystal display device. On the other hand, when a film made from a high reflective element such as silver, aluminum, or the like is used for the pixel electrode, a substrate used for a reflection type liquid crystal display device can be formed.

According to above steps, the driver circuit 555 composed of the n-channel TFT 551 and the p-channel TFT 552, and the pixel portion 556 including the pixel TFT 553 and the capacitance element 554 can be formed on the same substrate. Thus, the active matrix substrate can be completed.

[Embodiment 2]

Figure 9:
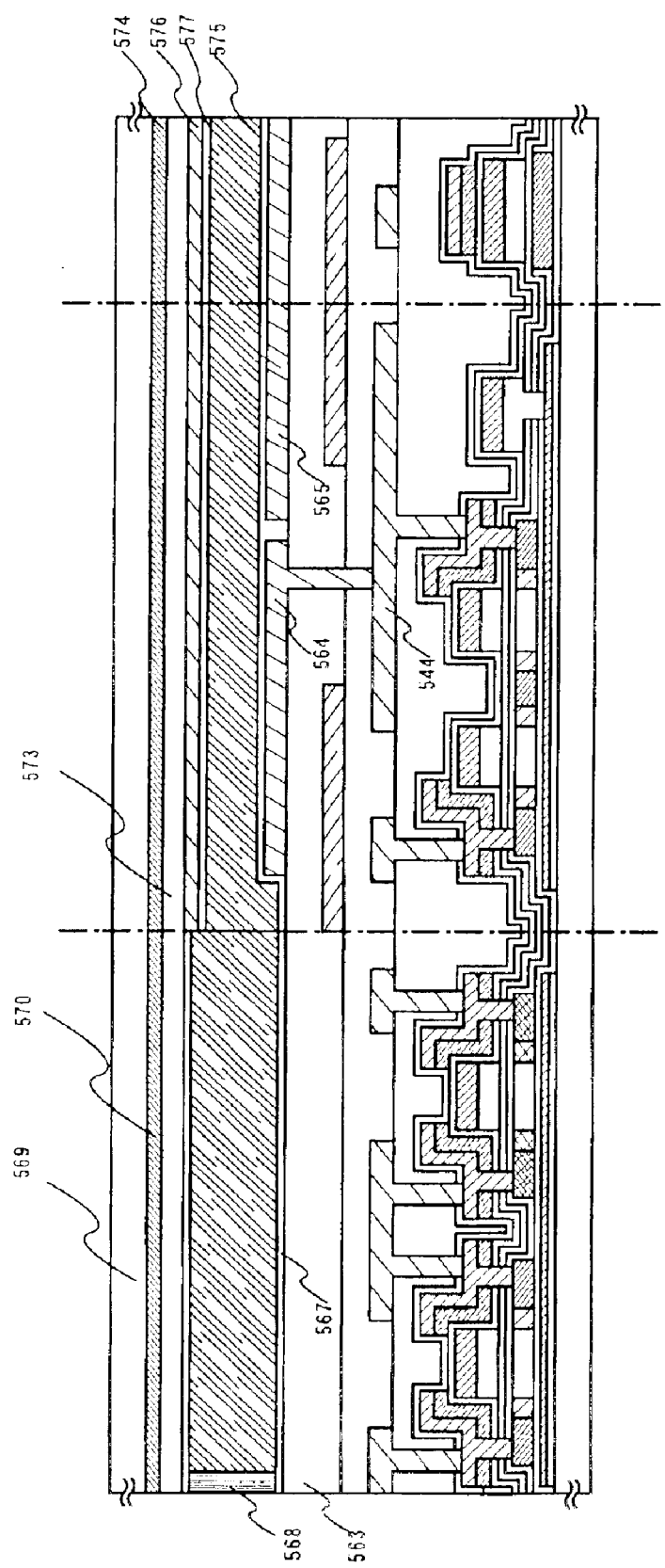
FIG. 9 is a cross sectional view showing a process of preparing an active-matrix liquid crystal display device.

In this embodiment, a process of manufacturing a reflection type liquid crystal display device from the active matrix substrate formed in Embodiment 1 is described below with reference to FIG. 9.

An active matrix substrate in the state of FIG. 8B is first obtained in accordance with Embodiment 1, an orientation film 567 is then formed on at least the pixel electrodes 564, 565 on the active matrix substrate of FIG. 8B, and a rubbing process is performed. Note that, before forming the orientation film 567 in this embodiment, columnar spacer is formed in desired positions by etching an organic resin film such as an acrylic resin film and the like, in order to maintain a gap between substrates. In this embodiment, in order to manufacture a reflective liquid crystal display device, the pixel electrode is formed by using an aluminum film.

An opposing substrate 569 is prepared next. Coloring layer 570, and a leveling film 573 are then formed on the opposing substrate 569.

An opposing electrode 576 made from a transparent conductive film is formed on the leveling film 573 over at least the pixel portion, an orientation film 577 is formed over the entire surface of the opposing substrate, and a rubbing process is carried out.

The active matrix substrate on which the pixel portion and the driver circuit are formed, and the opposing substrate are then joined by a sealing material 568. A filler is mixed into the sealing material 568, and the two substrates are joined while maintaining a uniform gap in accordance with the filler and the columnar spacers. A liquid crystal material 575 is then injected between both substrates, and the substrates are completely sealed by using a sealant (not shown). A known liquid crystal material may be used for the liquid crystal material 575. The reflection type liquid crystal display device shown in FIG. 9 is thus completed. The active matrix substrate or the opposing substrate is then cut into a desired shape if necessary. In addition, a polarizing plate (not shown) is attached to only the opposing substrate 569. An FPC is then attached using a known technique (not shown).

The resultant liquid crystal display device made by above-mentioned method has a plurality of capacitor elements stacked vertically so as to raise an opening ratio with maintaining sufficient capacitance. Thus, high-definition and high-luminance display can be realized.

Since a buffer layer is formed between the conductive film used for a capacitor electrode and dielectrics, the stress generated when forming the conductive film used for a capacitor electrode can be relaxed. Therefore, a phenomenon of a semiconductor film crack due to the stress can be controlled, and the liquid crystal display device having an improved operation characteristic and reliability can be manufactured.

More specifically, the liquid crystal display device which can be obtained high-luminance and high-definition display can be manufactured. Especially, when the liquid crystal display device of the present invention is used for a projection type display device such as a projector, a luminance can be improved, and also high-luminance and high-definition display can be obtained.

In addition, such liquid crystal display devices can be used for a display portion of various electronic apparatus.

[Embodiment 3]

In this embodiment, an example of manufacturing a light emitting device by using the present invention. The light emitting device is the general term for the display panel enclosed a light emitting element formed on the substrate between the substrate and the cover member, and to the display module equipped TFT with the display panel. Incidentally, the light emitting element has a layer including a compound in which an electroluminescence can be obtained by applying an electric field (hereinafter, EL layer), an anode layer, and a cathode layer. Meanwhile, the electroluminescence includes the light emission (fluorescence) upon returning from the singlet-excited state to the ground state and the light emission (phosphorescence) upon returning from the triplet-excited state to the ground state, including any or both of light emission.

In addition, all layers formed between the anode and the cathode in the light emitting element are defined as EL layer. The light emitting layer, the hole injection layer, the electron injection layer, the hole transportation layer, and the electron transportation layer, etc. are concretely included in EL layer. The light emitting element basically has the structure that the anode layer, the light emitting layer, and the cathode layer are sequentially laminated. In addition to this structure, the light emitting element may also has a structure that the anode layer, the hole injection layer, the light emitting layer, and the cathode layer are sequentially laminated or a structure that the anode layer, the hole injection layer, the light emitting layer, the hole transportation layer, and the cathode layer etc. are sequentially laminated.

Figure 10:
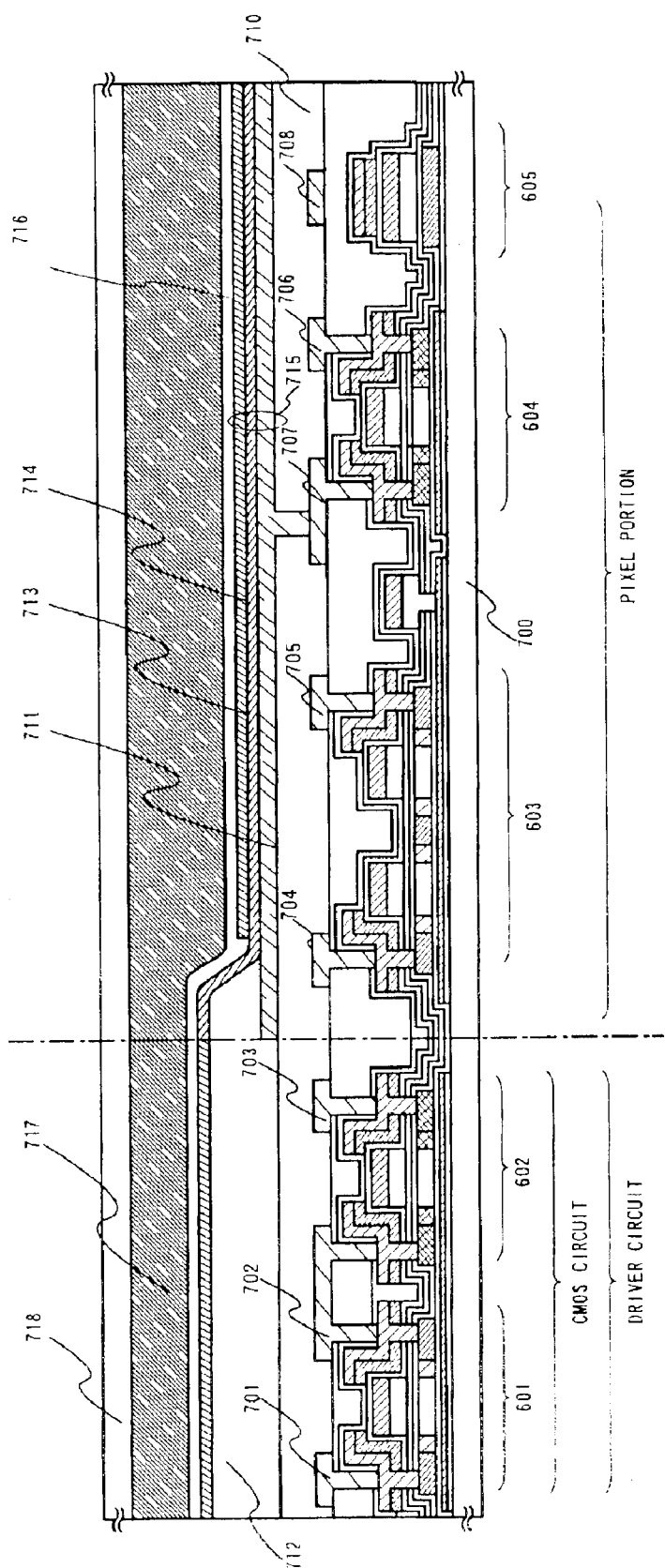
FIG. 10 is a cross-sectional structural view showing a driving circuit and a pixel unit of a light-emitting device.

FIG. 10 is a sectional view of a light emitting device of this embodiment. The driver circuit provided on the substrate 700 is formed by using the driver circuit of FIG. 7B. Consequently, concerning the explanation of the structure, it is satisfactory to refer the explanation on the n-channel TFT 551 and p-channel TFT 552 of Embodiment 1. Incidentally, although this embodiment is of a single gate structure, it is possible to use a double gate structure or a triple gate structure.

Meanwhile, the wirings 701 to 703 serve as source wirings and drain wirings of the CMOS circuit. Meanwhile, a wiring 704 serves as a wiring to electrically connect between the source wiring and the source region of the switching TFT while the wiring 705 serves as a wiring to electrically connect between the drain wiring and the drain region of the switching TFT. In FIG. 10, a switching TFT 603 provided on the substrate is formed by using the n-channel TFT 551 of FIG. 7B. Consequently, concerning the explanation of the structure, it is satisfactory to refer to the explanation on the n-channel TFT 551 described in Embodiment 1.

Incidentally, with respect to the switching TFT 603, this example is a double gate structure in which two channel formation regions are formed though, it is possible to use a single gate structure in which one channel formation region is formed or a triple gate structure in which three channel formation regions are formed.

An auxiliary capacity 605 is formed by using a capacitor element 554 of FIG. 7B. Consequently, concerning the explanation of the structure, it is satisfactory to refer to the explanation on the capacitor element 554 described in Embodiment 1.

A current control TFT 604 is formed by using the p-channel TFT 552 shown in FIG. 7B. Therefore, concerning the explanation of the structure, it is satisfactory to refer to the explanation on the p-channel TFT 552 described in Embodiment 1. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 711 and the current control TFT 604 by overlapping the pixel electrode 711 on the current control TFT 604.

Meanwhile, reference numeral 711 is a pixel electrode (anode of a light-emitting element) formed by a transparent conductive film. As the transparent conductive film, a compound of indium oxide and tin oxide, a compound of indium oxide and zinc oxide, zinc oxide, tin oxide, or indium oxide may be used. Otherwise, a transparent conductive film added with gallium may also be used. The pixel electrode 711 is formed on a planar interlayer insulating film 710 prior to forming the wirings. A light-emitting layer to be formed later possibly causes, since the thickness thereof is extremely thin, poor light emission due to the presence of a step. Accordingly, it is preferable to provide planarization prior to forming a pixel electrode.

After forming the wirings 701 to 708, a bank 712 is formed as shown in FIG. 10. The bank 712 may be formed by etching an inorganic insulating film or organic resin film having a thickness of 100 to 400 nm.

Incidentally, since the bank 712 is an insulating film, caution must be paid to element electrostatic breakdown during deposition. In this embodiment, static electricity is suppressed by adding a carbon particle or metal particle to an insulating film as a material for the bank 712 to reduce resistivity. In such a case, the addition amount of carbon or metal particle may be adjusted to provide a resistivity of $1 \times 10^6$ to $1 \times 10^{12}$ Ωm (preferably $1 \times 10^8$ to $1 \times 10^{10}$ Ωm).

EL layer 713 is formed on the pixel electrode 711. Incidentally, although FIG. 10 shows only one pixel, this embodiment separately forms EL layer correspondingly to the respective colors of R (red), G (green) and B (blue). Meanwhile, in this embodiment, EL layer is formed by using a low molecular weight organic light emitting material by the deposition process. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light-emitting layer. The color of emission light can be controlled by adding a fluorescent pigment, such as quinacridone, perylene or DCM1, to $Alq_3$.

However, the foregoing example is an example of light emitting materials to be used for EL layer and not necessarily limited to this. Organic materials and inorganic materials can be used to form the light-emitting layer. It is satisfactory to form EL layer (layer for light emission and carrier movement therefor) by freely combining light emitting layer, a charge transporting layer, and an electron injecting layer. For example, although in this embodiment was shown the example in which a low molecular weight organic light emitting material is used for a light-emitting layer, it is possible to use an intermediate organic light emitting material and a high molecular weight organic light emitting material. Furthermore, in this specification, an intermediate molecular weight organic light-emitting material can be defined that an aggregate of an organic compound which does not have subliming property or dissolving property (preferably, an aggregate which has molecularity of 10 or less), or an organic compound which has a molecular chain length of 5 µm of less (preferably 50 nm or less). As an example of using the high molecular weight organic light emitting material, the lamination structure in which a polythiophene (PEDOT) film having a thickness of 20 nm as a hole injection layer is formed by the spin coating method and a paraphenylenvinylene (PPV) film having a thickness of about 100 nm as a light emitting layer is formed thereon can be formed. The luminescence wave length can be selected from red to blue by using the π-conjugated type polymer of PPV. Meanwhile, it is possible to use an inorganic material such as silicon carbide for an electron transporting layer or charge injecting layer. These organic light emitting materials or inorganic materials can be a known material.

Next, a cathode 714 of a conductive film is provided on EL layer 713. In this embodiment, as the conductive film, used is an alloy film of aluminum and lithium. Of course, a known MgAg film (alloy film of magnesium and silver) may be used. As the cathode material may be used a conductive film of an element belonging to the periodic-table group 1 or 2, or a conductive film added with such an element.

A light-emitting element 715 is completed at the point of being formed the cathode 714. Incidentally, the light-emitting element 715 herein refers to a diode formed with a pixel electrode (anode) 711, EL layer 713 and a cathode 714.

It is effective to provide a passivation film 716 in such a manner to completely cover the light-emitting element 715. The passivation film 716 is formed by an insulating film including a carbon film, a silicon nitride film or a silicon oxynitride film, and used is an insulating film in a single layer or a combined lamination. In such a case, it is preferred to use a film favorable in coverage as a passivation film. It is effective to use a carbon film, particularly DLC (diamond-like carbon) film. The DLC film, capable of being deposited in a temperature range at most 100° C. from room temperature, can be easily deposited over the light-emitting layer 713 low in heat resistance. Meanwhile, the DLC film, having a high blocking effect to oxygen, can suppress the organic light-emitting layer 713 from oxidizing. Consequently, the problem of oxidation can be prevented in EL layer 713 during the following sealing process.

Furthermore, a sealing member 717 is provided on the passivation film 716 so as to bond a cover member 718. For the sealing member 717 used may be an ultraviolet curable resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light emitting device having a structure as shown in FIG. 10. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601, p-channel TFT 602, the switching TFT (n-channel TFT) 603, the current control TFT (p-channel TFT) 604, and the auxiliary capacity 605 are formed on the substrate.

Meanwhile, this embodiment shows only the configuration of the pixel portion and driver circuit. However, according to the manufacturing process in this embodiment, besides these, it is possible to form on the same insulating member such logic circuits as a signal division circuit, a D/A converter, an operation amplifier, a γ-correction circuit or the like. Furthermore, a memory or microprocessor can be formed.

A light-emitting device of this embodiment after the sealing (filling) process for protecting the light-emitting element will be described using FIG. 11. Note that, if necessary, reference symbols used in FIG. 10 are referred to.

Figure 11A:
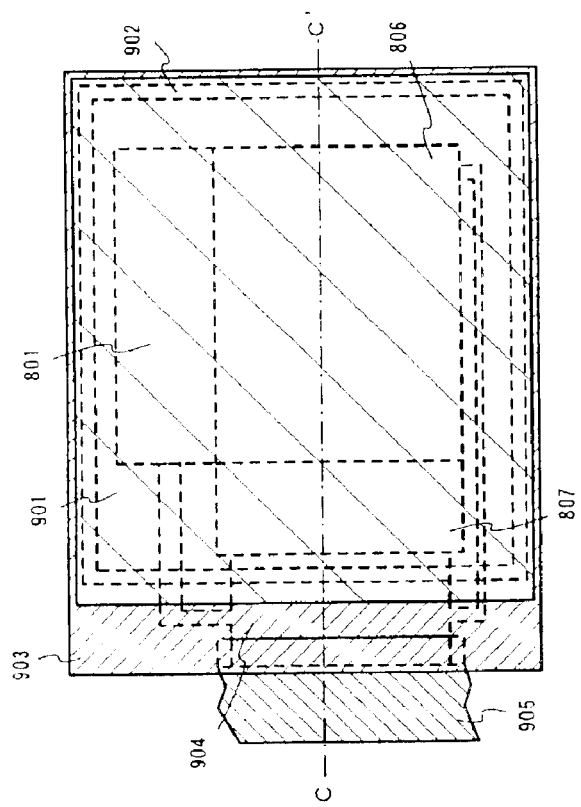
FIG. 11A is a top view of a light-emitting device.
Figure 11B:
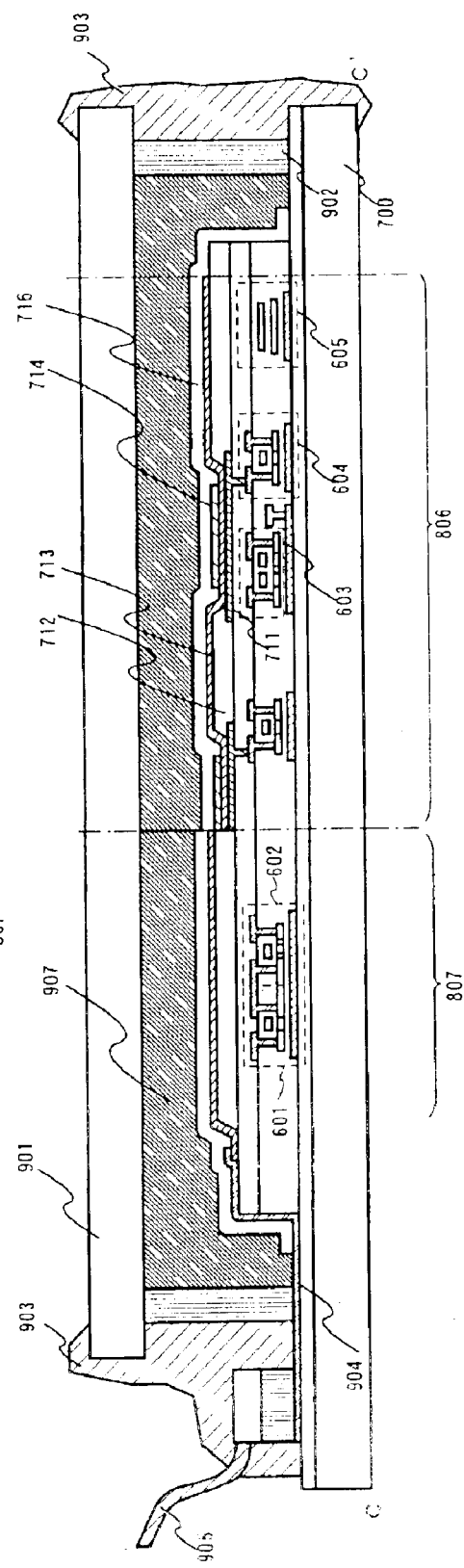
FIG. 11B is a cross-sectional structural view showing a driving circuit and a pixel unit of a light-emitting device.

FIG. 11A is a top view representing the state after the sealing of the light-emitting element, and FIG. 11B is a cross sectional view taken along a line C–C' of FIG. 11A. Reference numeral 801 shown by a dotted line denotes a source side driver circuit, reference numeral 806 denotes a pixel portion, and reference numeral 807 denotes a gate side driver circuit. Also, reference numeral 901 denotes a cover member, reference numeral 902 denotes a first sealing member, and reference numeral 903 denotes a second sealing member. A sealing member 907 is provided in the inside surrounded by the first sealing member 902.

Note that, reference numeral 904 denotes a wiring for transmitting signals inputted to the source side driver circuit 801 and the gate side driver circuit 807. The wiring 904 receives a video signal and a clock signal from an FPC (flexible printed circuit) 905 as an external input terminal. In FIG. 11A, although only the FPC is shown, a printed wiring board (PWB) may be attached to the FPC. The light-emitting device in this specification includes not only the main body of the light-emitting device but also the light-emitting device to which the FPC or the PWB is attached.

Next, the cross-sectional structure of FIG. 11A taken along the line C–C' will be described using FIG. 11B. The pixel portion 806 and the gate side driver circuit 807 are formed upper side of the substrate. The pixel portion 806 is formed by a plurality of pixels each having a current control TFT 604 and a pixel electrode 711 electrically connected with the drain region thereof. Also, the gate side driver circuit 807 is formed using the CMOS circuit in which an n-channel type TFT 601 and a p-channel type TFT 602 are combined with each other (see Embodiment 1 and FIG. 10).

The pixel electrode 711 functions as an anode of the light-emitting element. Also, banks 712 are formed in both ends of the pixel electrode 711. EL layer 713 and a cathode 714 of the light-emitting element are formed on the pixel electrode 711.

The cathode 714 also functions as a wiring common to all pixels, and is electrically connected with the FPC 905 through the connection wiring 904. Further, all elements which are included in the pixel portion 806 and the gate side driver circuit 807 are covered with the cathode 714 and a passivation film 716.

Also, the cover member 901 is adhered to the resultant substrate 700 by the first sealing member 902. Note that, in order to keep an interval between the cover member 901 and the light-emitting element, a spacer made of a resin film may be provided. Then, the inside of the first sealing member 902 is filled with a sealing member 907. Note that, it is preferred that epoxy resin is used as the first sealing member 902 and the sealing member 907. Also, it is desired that the first sealing member 902 is a material to which moisture and oxygen are not penetrated as much as possible. Further, a material having a hygroscopic effect or a material having an oxidation inhibition effect may be contained in the sealing member 907.

The sealing member 907 provided to cover the light-emitting element also functions as an adhesive for adhering the cover member 901 to the resultant substrate 700. Also, in this embodiment, FRP (fiberglass-reinforced plastics), PVF (polyvinyl fluoride), Mylar, polyester, or acrylic can be used as a material of a plastic substrate 901 composing the cover member 901.

Also, after the adhering of the cover member 901 using the sealing member 907, the second sealing member 903 is provided to cover side surfaces (exposed surfaces) of the sealing member 907. In the second sealing member 903, the same material as that of the first sealing member 902 can be used.

By sealing the light-emitting element with the sealing member 907 with the above structure, the light-emitting element can be completely shielded from the outside, and penetration of a substance (such as moisture or oxygen) which prompts deterioration due to oxidation of the organic light-emitting layer, from the outside, can be prevented. Thus, the light-emitting device with high reliability can be obtained.

Thus, wirings of the light emitting device formed according to above-mentioned has a sufficient contact with the semiconductor film. Therefore, enough operating characteristics and reliability of the light-emitting device can be obtained. By using the active matrix substrate used the structure of the present invention, the light-emitting device can be manufactured with a sufficient yields. Such light-emitting device can be used as a display portion of various electronic devices.

This embodiment can be performed by freely combining with Embodiment 1.

[Embodiment 4]

Various display devices (active matrix type liquid crystal display device, active matrix type light emitting device) can be formed by applying the present invention. Specifically, the present invention can be applied to various electronic apparatus in which such an electro-optical device is incorporated in a display portion.

Such electronic apparatus is a video camera, a digital camera, a projector, a head-mounted display (goggle type display), a car navigation system, a car stereo, a personal computer, a mobile information terminal (such as a mobile computer, a mobile telephone or an electronic book etc.) or the like. FIGS. 12 to 14 show one of its examples.

Figure 12A:
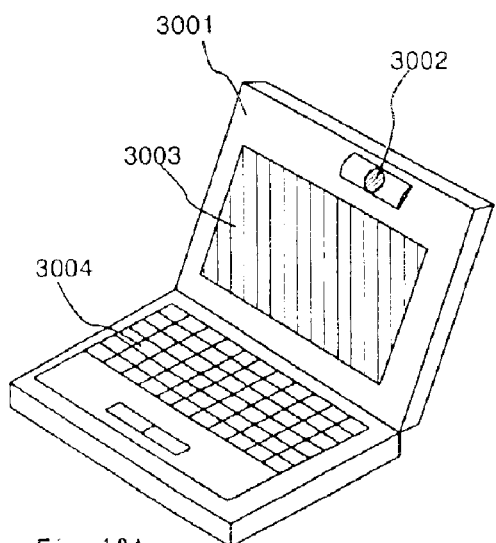
FIGS. 12A to 12F show examples of electronic equipment.

FIG. 12A shows a personal computer which includes a main body 3001, an image input portion 3002, a display portion 3003, a keyboard 3004 and the like. By applying the present invention, the low-power consumption personal computer which is capable of a high-definition display with high yields can be manufactured.

Figure 12B:
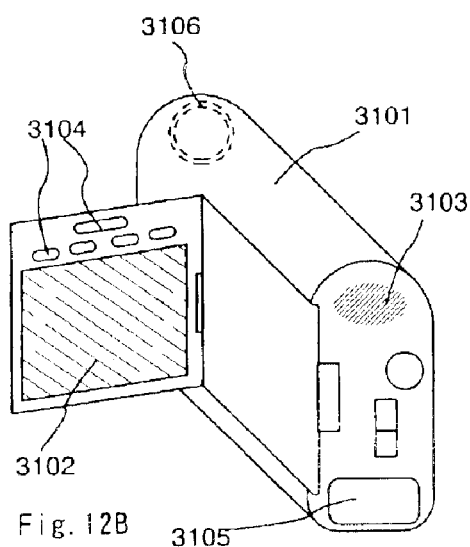

FIG. 12B shows a video camera which includes a main body 3101, a display portion 3102, a sound input portion 3103, operating switches 3104, a battery 3105, an image receiving portion 3106 and the like. By applying the present invention, the video camera which is capable of a high-definition display with high yields can be manufactured.

Figure 12C:
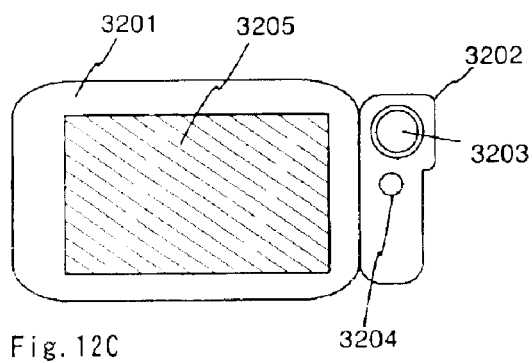

FIG. 12C shows a mobile computer which includes a main body 3201, a camera portion 3202, an image receiving portion 3203, an operating switch 3204, a display portion 3205 and the like. By applying the present invention, the low-power consumption mobile computer which is capable of a high-definition display with high yields can be manufactured.

Figure 12D:
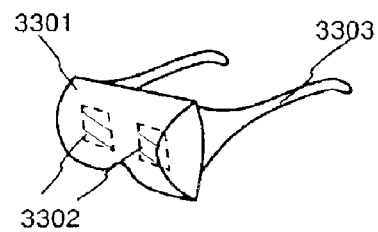

FIG. 12D shows a goggle type display which includes a main body 3301, a display portion 3302, arm portions 3303 and the like. By applying the present invention, the goggle type display which is capable of a high-definition display with high yields can be manufactured.

Figure 12E:
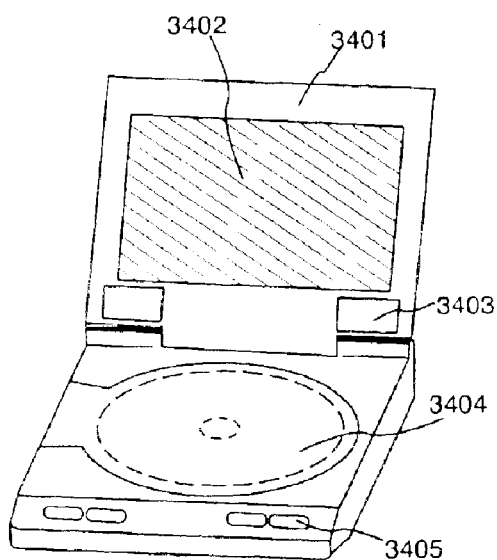

FIG. 12E shows a player using a recording medium on which a program is recorded (hereinafter, the recording medium), and the player includes a main body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. By applying the present invention, the player which is capable of a high-definition display with high yields can be manufactured.

Figure 12F:
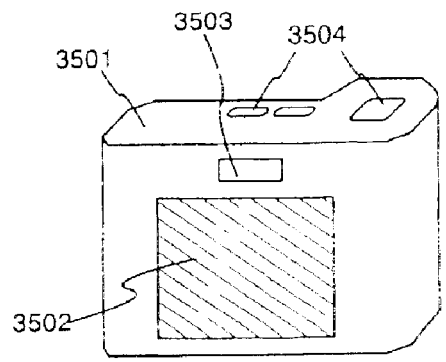

FIG. 12F shows a digital camera which includes a body 3501, a display portion 3502, an eyepiece portion 3503, operating switches 3504, an image receiving portion (not shown) and the like. By applying the present invention, the low-power consumption digital camera which is capable of a high-definition display with high yields can be manufactured.

FIG. 13A shows a front type projector which includes a projection device 3601, a screen 3602 and the like. By applying the present invention, the high-luminance front type projector which is capable of a high-luminance display with high yields can be manufactured.

FIG. 13B shows a rear type projector which includes a main body 3701, a projection device 3702, a mirror 3703, a screen 3704 and the like. By applying the present invention, the high-luminance rear type projector which is capable of a high-definition display with high yields can be manufactured.

FIG. 13C shows one example of the structure of each of the projection devices 3601 and 3702 which are respectively shown in FIGS. 13A and 13B. Each of the projection devices 3601 and 3702 is made of a light source optical system 3801, mirrors 3802 and 3804 to 3806, a dichroic mirror 3803, a prism 3807, a liquid crystal display device 3808, a phase difference plate 3809 and a projection optical system 3810. The projection optical system 3810 is made of an optical system including a projection lens. This embodiment is an example of a three-plate type, but it is not limited to this example and may also be of a single-plate type. In addition, those who implement the invention may appropriately dispose an optical system such as an optical lens, a film having a polarization function, a film for adjusting phase difference, an IR film or the like in the path indicated by arrows in FIG. 13C.

FIG. 13D is a view showing one example of the structure of the light source optical system 3801 shown in FIG. 13C. In this embodiment, the light source optical system 3801 is made of a reflector 3811, a light source 3812, lens arrays 3813 and 3814, a polarizing conversion element 3815 and a condenser lens 3816. Incidentally, the light source optical system shown in FIG. 13D is one example, and the invention is not particularly limited to the shown construction. For example, those whose implement the invention may appropriately dispose an optical system such as an optical lens, a film having a polarization function, a film for adjusting phase difference, an IR film or the like.

The projector shown in FIG. 13 is the case of using a transparent type of liquid crystal display device, but there is not shown an example in which the invention is applied to a reflection type of liquid crystal display device.

Figure 14A:
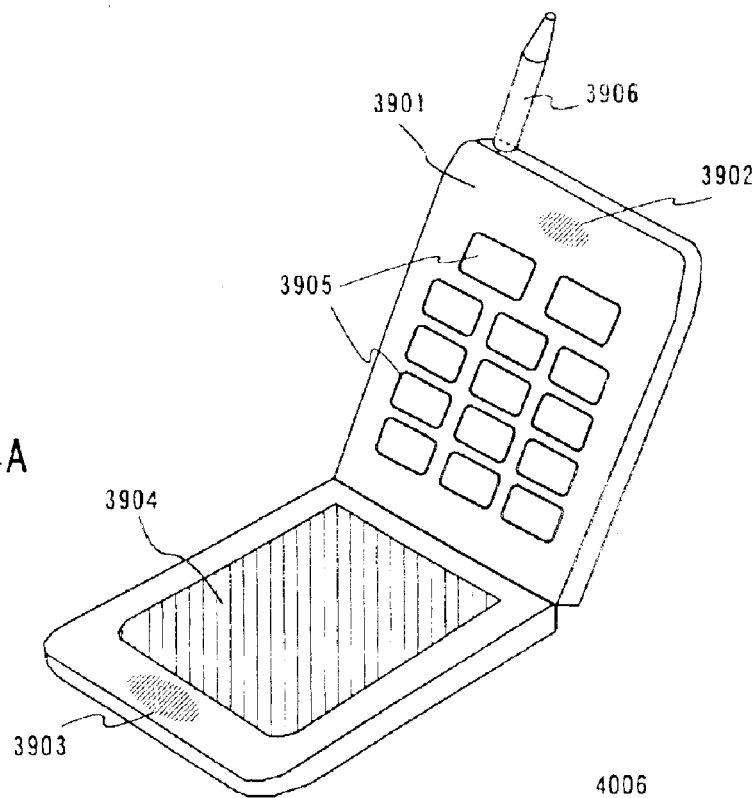
FIGS. 14A to 14C show examples of electronic equipment.

FIG. 14A shows a mobile telephone which includes a main body 3901, a sound output portion 3902, a sound input portion 3903, a display portion 3904, operating switches 3905, an antenna 3906 and the like. By applying the present invention, the low-power consumption mobile telephone which is capable of a high-definition display with high yields can be manufactured.

Figure 14B:
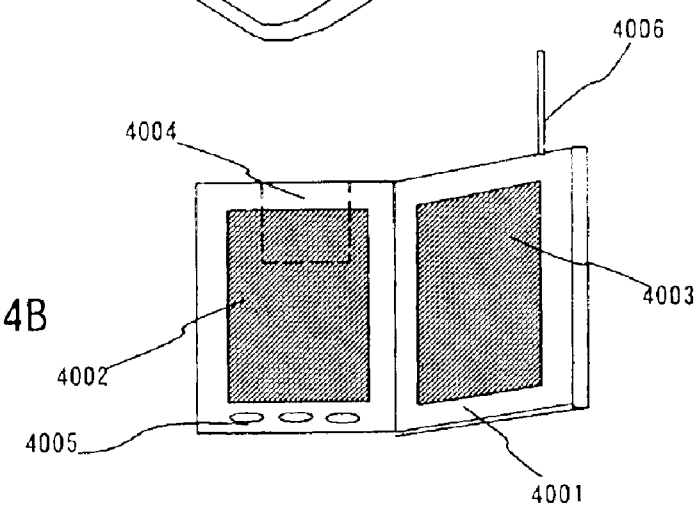

FIG. 14B shows a mobile book (electronic book) which includes a main body 4001, display portions 4002 and 4003, a storage medium 4004, operating switches 4005, an antenna 4006 and the like. By applying the present invention, the low-power consumption mobile book which is capable of a high-definition display with high yields can be manufactured.

Figure 14C:
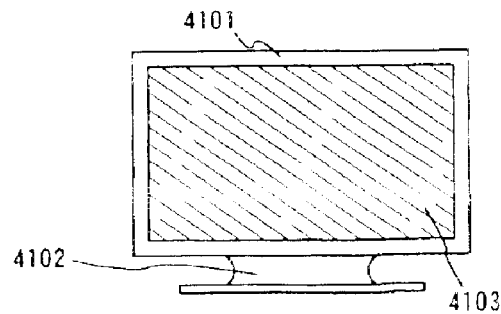

FIG. 14C shows a display which includes a main body 4101, a support base 4102, a display portion 4103 and the like. The invention is particularly advantageous to a large-screen display, and is advantageous to a display having a diagonal size of 10 inches or more (particularly, 30 inches or more).

In addition, the range of applications of the invention is extremely wide, and the invention can be applied to any category of electronic apparatus. Electronic apparatus according to the invention can be realized by using structures that is composed of any combination of Embodiments 1 to 4.

As the structure of this invention is employed, the following advantages can be achieved.

In a semiconductor device having a TFT and plural capacitors vertically stacked on a substrate, a conductive film as a buffer layer for buffering stress of a subsequently formed conductive layer is formed on an insulating film, which is a dielectric of the capacitors, and a contact hole is formed in a part of the buffer layer and the insulating film. After that a conductive film is formed and etched to form a source electrode and a drain electrode. This structure enables restraint of crack of a semiconductor film, a capacitance wiring and the like due to stress and formation of a semiconductor having a TFT and plural capacitors.

In the semiconductor device having a TFT and capacitors vertically stacked on a substrate, by forming the buffer layer on the insulating film, which is a dielectric, it is possible to protect the insulating film, which is a dielectric, from the shock of sputtering. Therefore, capacitance electrodes can be formed by a sputtering method and the selection ratio of a forming method and material for forming the capacitance electrodes is increased.

As the source electrode and the drain electrode to cover a part of the gate electrode of the TFT, the electrodes function as shade films. Therefore, stray light can be shut out and the OFF-state current of the TFT can be restrained.

That is, this invention enables preparation of a semiconductor device that can hold high capacitance at a high yield. Particularly when the semiconductor device is a display device, since the opening rate can be increased, a display device that can realize high-luminance and high-definition display while securing sufficient capacitance can be prepared at a high yield.

What is claimed is:

1. A semiconductor device comprising:
    a thin film transistor, a first capacitor and a second capacitor formed over a substrate;
    wherein the first capacitor has a first capacitance electrode and a second capacitance electrode formed with a first dielectric layer therebetween,
    wherein the second capacitor has the second capacitance electrode and a third capacitance electrode formed with a second dielectric layer therebetween,
    wherein an insulating film is formed over the thin film transistor,
    wherein a connection wiring is formed over the insulating film and is connected to an active region of the thin film transistor,
    wherein a buffer layer is formed between the second dielectric and the third capacitance electrode and between the first insulating film and the connection wiring.

2. The semiconductor device according to claim 1, wherein the buffer layer is a film to relax stress generated when forming the third capacitance electrode and the connection wiring.

3. The semiconductor device according to claim 1, wherein the buffer layer is one of a crystalline semiconductor film and an amorphous semiconductor film.

4. The semiconductor device according to claim 1, wherein the buffer layer has a thickness of 10 to 100 nm.

5. The semiconductor device according to claim 1, wherein the buffer layer is not in contact with the active region of the thin film transistor.

6. The semiconductor device according to claim 1, wherein the connection wiring is at least one of a source electrode and a drain electrode.

7. The semiconductor device according to claim 1, wherein the semiconductor device is a liquid crystal display device which is incorporated into an electronic equipment selected from the group consisting of a video camera, a digital camera, a projector, a head-mounted display, a car navigation system, a car stereo, a personal computer and a mobile information terminal.

8. The semiconductor device according to claim 1, wherein the semiconductor device is a light-emitting device which is incorporated into an electronic equipment selected from the group consisting of a video camera, a digital camera, a projector, a head-mounted display, a car navigation system, a car stereo, a personal computer and a mobile information terminal.

9. A semiconductor device comprising:
    a thin film transistor formed over a substrate;
    an insulating film formed over the thin film transistor;
    a buffer layer formed over the insulating film; and
    a connection wiring formed over the buffer layer,
    wherein the connection wiring is directly connected to an active region of the thin film transistor through a contact hole formed in the buffer layer and the insulating film,
    wherein the buffer layer comprises an amorphous silicon.

10. The semiconductor device according to claim 9, wherein the buffer layer is a film to relax stress generated when forming the connection wiring.

11. The semiconductor device according to claim 9, wherein the buffer layer has a thickness of 10 to 100 nm.

12. The semiconductor device according to claim 9, wherein the buffer layer is not in contact with the active region of the thin film transistor.

13. The semiconductor device according to claim 9, wherein the connection wiring is at least one of a source electrode and a drain electrode.

14. The semiconductor device according to claim 9, wherein the semiconductor device is a liquid crystal display device which is incorporated into an electronic equipment selected from the group consisting of a video camera, a digital camera, a projector, a head-mounted display, a car navigation system, a car stereo, a personal computer and a mobile information terminal.

15. The semiconductor device according to claim 9, wherein the semiconductor device is a light-emitting device which is incorporated into an electronic equipment selected from the group consisting of a video camera, a digital camera, a projector, a head-mounted display, a car navigation system, a car stereo, a personal computer and a mobile information terminal.

16. A semiconductor device comprising:

a thin film transistor formed over a substrate;

an insulating film formed over the thin film transistor;

a buffer layer formed over the insulating film; and a connection wiring formed over the buffer layer, wherein the connection wiring is directly connected to an active region of the thin film transistor through a contact hole formed in the buffer layer and the insulating film, wherein the buffer layer comprises a crystalline silicon.

17. The semiconductor device according to claim 16, wherein the buffer layer is a film to relax stress generated when forming the connection wiring.

18. The semiconductor device according to claim 16, wherein the buffer layer has a thickness of 10 to 100 nm.

19. The semiconductor device according to claim 16, wherein the buffer layer is not in contact with the active region of the thin film transistor.

20. The semiconductor device according to claim 16, wherein the connection wiring is at least one of a source electrode and a drain electrode.

21. The semiconductor device according to claim 16, wherein the semiconductor device is a liquid crystal display device which is incorporated into an electronic equipment selected from the group consisting of a video camera, a digital camera, a projector, a head-mounted display, a car navigation system, a car stereo, a personal computer and a mobile information terminal.

22. The semiconductor device according to claim 16, wherein the semiconductor device is a light-emitting device which is incorporated into an electronic equipment selected from the group consisting of a video camera, a digital camera, a projector, a head-mounted display, a car navigation system, a car stereo, a personal computer and a mobile information terminal.

23. A semiconductor device comprising:

a first capacitance electrode formed over a substrate;

a first dielectric layer formed over the first capacitance layer;

a second capacitance electrode formed over the first dielectric layer;

a second dielectric layer formed over the second capacitance layer;

a buffer layer formed over the second dielectric layer; and a third capacitance electrode formed over the buffer layer, wherein the buffer layer comprises an amorphous silicon.

24. The semiconductor device according to claim 23, wherein the buffer layer is a film to relax stress generated when forming the third capacitance electrode.

25. The semiconductor device according to claim 23, wherein the buffer layer has a thickness of 10 to 100 nm.

26. The semiconductor device according to claim 23, wherein the semiconductor device is a liquid crystal display device which is incorporated into an electronic equipment selected from the group consisting of a video camera, a digital camera, a projector, a head-mounted display, a car navigation system, a car stereo, a personal computer and a mobile information terminal.

27. The semiconductor device according to claim 23, wherein the semiconductor device is a light-emitting device which is incorporated into an electronic equipment selected from the group consisting of a video camera, a digital camera, a projector, a head-mounted display, a car navigation system, a car stereo, a personal computer and a mobile information terminal.

28. A semiconductor device comprising:

a first capacitance electrode formed over a substrate;

a first dielectric layer formed over the first capacitance layer;

a second capacitance electrode formed over the first dielectric layer;

a second dielectric layer formed over the second capacitance layer;

a buffer layer formed over the second dielectric layer; and a third capacitance electrode formed over the buffer layer, wherein the buffer layer comprises a crystalline silicon.

29. The semiconductor device according to claim 28, wherein the buffer layer is a film to relax stress generated when forming the third capacitance electrode.

30. The semiconductor device according to claim 28, wherein the buffer layer has a thickness of 10 to 100 nm.

31. The semiconductor device according to claim 28, wherein the semiconductor device is a liquid crystal display device which is incorporated into an electronic equipment selected from the group consisting of a video camera, a digital camera, a projector, a head-mounted display, a car navigation system, a car stereo, a personal computer and a mobile information terminal.

32. The semiconductor device according to claim 28, wherein the semiconductor device is a light-emitting device which is incorporated into an electronic equipment selected from the group consisting of a video camera, a digital camera, a projector, a head-mounted display, a car navigation system, a car stereo, a personal computer and a mobile information terminal.

* * * * *